US011482525B2

(12) United States Patent
Chen

(10) Patent No.: US 11,482,525 B2
(45) Date of Patent: Oct. 25, 2022

(54) METHOD FOR MANUFACTURING SEMICONDUCTOR STRUCTURE WITH CAPACITOR LANDING PAD

(71) Applicant: NANYA TECHNOLOGY CORPORATION, New Taipei (TW)

(72) Inventor: Chih-Hung Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 51 days.

(21) Appl. No.: 17/129,063

(22) Filed: Dec. 21, 2020

(65) Prior Publication Data

US 2022/0199623 A1 Jun. 23, 2022

(51) Int. Cl.
*H01L 27/108* (2006.01)
*G11C 5/10* (2006.01)

(52) U.S. Cl.
CPC ............ *H01L 27/1087* (2013.01); *G11C 5/10* (2013.01); *H01L 27/10823* (2013.01)

(58) Field of Classification Search
CPC ......... H01L 27/10814; H01L 27/10847; H01L 27/10852; H01L 27/10867; H01L 27/1087; H01L 27/10885
USPC ...................................................... 438/262
See application file for complete search history.

(56) References Cited

U.S. PATENT DOCUMENTS

| 2015/0061136 | A1 | 3/2015 | Yoo et al. |
| 2015/0340281 | A1* | 11/2015 | Lee ..................... H01L 21/7682 |
| | | | 438/618 |
| 2018/0261603 | A1 | 9/2018 | Wang et al. |
| 2019/0043865 | A1 | 2/2019 | Chang et al. |
| 2020/0219732 | A1 | 7/2020 | Lee et al. |
| 2021/0098460 | A1* | 4/2021 | Lee ................... H01L 27/10823 |

FOREIGN PATENT DOCUMENTS

| TW | I596775 B | 8/2017 |
| TW | 201803021 A | 1/2018 |

* cited by examiner

*Primary Examiner* — Hoai V Pham
(74) *Attorney, Agent, or Firm* — Muncy, Geissler, Olds & Lowe, P.C.

(57) ABSTRACT

The present disclosure provides a method for manufacturing a semiconductor structure with capacitor landing pads. The method includes the following operations: providing a semiconductor substrate; forming a bit line structure protruding from the semiconductor substrate; depositing a landing pad layer to cover the bit line structure; planarizing a top surface of the landing pad layer; limning a trench in the landing pad layer to form the capacitor landing pads; forming an air gap within a sidewall of the bit line structure; and filling a first dielectric layer in the trench to seal the air gap.

19 Claims, 28 Drawing Sheets

METHOD FOR MANUFACTURING SEMICONDUCTOR STRUCTURE WITH CAPACITOR LANDING PAD

TECHNICAL FIELD

The present disclosure relates to method for manufacturing a semiconductor structure with a capacitor landing pad, and more particularly, to a method for manufacturing the capacitor landing pad in memory device.

DISCUSSION OF THE BACKGROUND

In the semiconductor industry, the products develop toward direction of miniaturization. The design of memory units also moves toward the direction of higher integration and higher density. In order to achieve higher density and high integration, the pitch size is designed smaller and smaller. However, the smaller pitch size causes higher aspect ratio. In other words, elements in the memory unit are designed to have higher aspect ratio. On the other hand, elements having high aspect ratio cause an issue of structural stability during manufacturing which affects the throughput of the manufacturing. Therefore, the stability issue needs to be improved when the aspect ratio keeps increasing.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a semiconductor structure with capacitor landing pads. The method includes the following operations: providing a semiconductor substrate; forming a bit line structure protruding from the semiconductor substrate; depositing a landing pad layer to cover the bit line structure; planarizing a top surface of the landing pad layer; forming a trench in the landing pad layer to form the capacitor landing pads; forming an air gap within a sidewall of the bit line structure; and filling a first dielectric layer in the trench to seal the air gap.

In some embodiments, the operation of forming the trench in the landing pad layer to form the capacitor landing pads includes the following operations: depositing a plurality of masking layers on the landing pad layer; performing a forward double patterning on the plurality of masking layers to form a hard mask on the landing pad layer; and etching the landing pad layer to form the trench according to the hard mask.

In some embodiments, the operation of depositing the plurality of masking layers on the landing pad layer includes the following operations: depositing a first carbon layer on the landing pad layer; and depositing a second dielectric layer on the first carbon layer.

In some embodiments, the operation of depositing the plurality of masking layers on the landing pad layer further includes the following operations: forming a second carbon layer on the second dielectric layer; forming a third dielectric layer on the second carbon layer; forming a third carbon layer on the third dielectric layer; and forming a fourth dielectric layer on the third carbon layer.

In some embodiments, a height of the first carbon layer is substantially equal to 90 nm, the second dielectric layer includes silicon nitride, the third dielectric layer is a dielectric anti-reflective coating including silicon, and the fourth dielectric layer is a dielectric anti-reflective coating including oxygen.

In some embodiments, the operation of performing the forward double patterning on the plurality of masking layers to form the hard mask on the landing pad layer includes the following operations: patterning the fourth dielectric layer and the third dielectric layer; and etching the fourth dielectric layer, the third carbon layer, the third dielectric layer, and the second carbon layer to form a plurality of carbon rods in the second carbon layer.

In some embodiments, the operation of performing the forward double patterning on the plurality of masking layers to form the hard mask on the landing pad layer further includes deposition an oxide layer to cover the plurality of carbon rods.

In some embodiments, the oxide layer is deposited by an atomic layer deposition (ALD) technology.

In some embodiments, the operation of performing the forward double patterning on the plurality of masking layers to form the hard mask on the landing pad layer further planarizing a top surface of the oxide layer, wherein the top surface of the oxide layer and a top surface of the plurality of carbon rods are coplanar. The remained oxide layer is an upper portion of the hard mask.

In some embodiments, the operation of performing the forward double patterning on the plurality of masking layers to form the hard mask on the landing pad layer further includes etching the plurality of carbon rods, the second dielectric layer, and the first carbon layer to limn the hard mask according to the remained oxide layer.

In some embodiments, the operation of etching the landing pad layer to form the trench according to the hard mask includes etching a portion of the sidewall and a portion of a nitride layer of the bit line structure to expose a top surface of the sidewall of the bit line structure.

In some embodiments, the operation of etching the landing pad layer to form the trench according to the hard mask further includes the following operations: etching the landing pad layer to reach a top surface of the bit line structure; and etching a portion of an adhesive layer of the bit line structure, wherein the adhesive layer includes titanium nitride.

In some embodiments, the operation of forming the trench in the landing pad layer to form the capacitor landing pads further includes performing an aching etching to remove the plurality of masking layers.

In some embodiments, the sidewall of the bit line structure includes an inner dielectric layer, an outer dielectric layer, and a middle oxide layer disposed between the inner dielectric layer and the outer dielectric layer. The operation of forming the air gap within the sidewall of the bit line structure includes etching the middle oxide layer.

In some embodiments, the middle oxide layer is etched by gaseous hydrofluoric acid.

In some embodiments, the method further includes the following operations: planarizing the first dielectric layer, wherein the first dielectric layer and the capacitor landing pads are coplanar; and depositing a fifth dielectric layer on the first dielectric layer and the capacitor landing pads. The fifth dielectric layer includes silicon nitride.

In some embodiments, the trench is partially aligned with the bit line structure.

In some embodiments, the semiconductor substrate includes a first active region, a second active region, and an isolation region disposed between the first active region and the second active region. A bit line contact structure of the bit line structure is formed in contact with the first active region.

In some embodiments, the method further includes the following operations: forming a landing pad contact structure coupled the second active region of the semiconductor substrate; and forming a cobalt silicide layer coupled the landing pad contact structure.

In some embodiments, each of the capacitor landing pads has a step shape. A width of an upper portion of the capacitor landing pads is greater than a width of a bottom portion of the capacitor landing pads.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
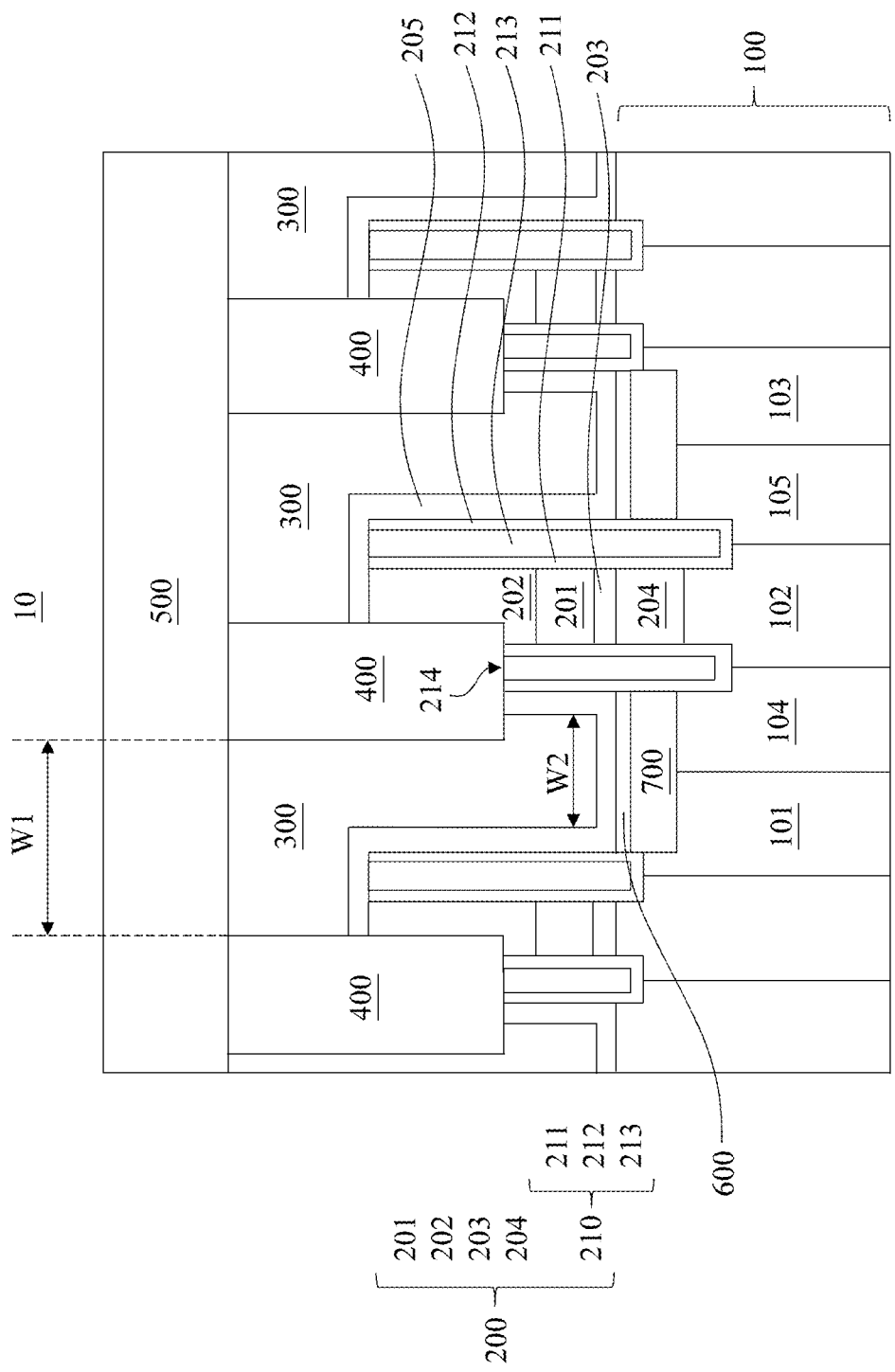
FIG. 1 is a schematic diagram of a semiconductor structure according to some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of a semiconductor structure 10 according to some embodiments of the present disclosure. The semiconductor structure 10 includes a semiconductor substrate 100, bit line structures 200, capacitor landing pads 300, a dielectric layer 400, and a dielectric layer 500. The bit line structures 200 protrudes from the semiconductor substrate 100. The capacitor landing pads 300 are disposed between the bit line structures 200. The dielectric layer 400 is filled between the capacitor landing pads 300 to isolate the capacitor landing pads 300 from each other. The dielectric layer 500 is disposed above the capacitor landing pads 300 and the dielectric layer 400. As illustrated in FIG. 1, the capacitor landing pads 300 and the dielectric layer 400 are coplanar.

In FIG. 1, the semiconductor structure 10 further includes an adhesive layer 600 and a contact structure 700. The contact structure 700 is electrically coupled to the active region 101. In some embodiments, the contact structure 700 is configured to provide an ohmic contact for the active region 101 to the capacitor landing pad 300. In other words, the contact structure 700 is configured to enhance the transportation of the electrical carriers between the active region 101 and the capacitor landing pad 300. The adhesive layer 600 is disposed between the capacitor landing pad 300 and the contact structure 700. In some embodiments, the adhesive layer 60 is configured to provide better adhesion between the contact structure 700 and the capacitor landing pad 300. The capacitor landing pad 300 is electrically coupled to the active region 101 via the adhesive layer 600 and the contact structure 700 in some embodiments, the adhesive layer 600 includes cobalt silicide ($Co_2Si$). In some embodiments, the contact structure 700 includes polysilicon.

The semiconductor substrate 100 includes conductive regions and isolation regions, and the isolation regions are configured to isolate the conductive regions to each other. As shown in FIG. 1, the semiconductor substrate 100 includes an active region 101, an active region 102, an active region 103, an isolation region 104, and an isolation region 105. The isolation region 104 is disposed between the active region 101 and the active region 102, and the isolation region 1015 is disposed between the active region 102 and the active region 103.

In some embodiments, the active region 101, the active region 102, and the active region 103 are silicon doped with dopants. In some embodiments, the active region 101, the active region 102, and the active region 103 have the same dopant type, for example, N-type. In some embodiments, the isolation region 104 and the isolation region 105 are shallow trench isolation (STI). In some embodiments, the isolation region 104 and the isolation 105 are further configured to prevent the capacitor landing pads 300 from electrically coupling to the active region 102.

In order to facilitate understanding, only one bit line structure 200 is described and denoted with numerals in FIG. 1. The bit line structure 200 is electrically coupled to the active region 102. In FIG. 1, the bit line structure 200 includes metal layer 201, a dielectric layer 202, an adhesive layer 203, a contact structure 204, an adhesive layer 205, and a sidewall 210.

The metal layer 201, the dielectric layer 202, the adhesive layer 203, and the contact structure 204 are sandwiched by the sidewall 210. The dielectric layer 202 is disposed on the metal layer 201, and in contact with the metal layer 201 and the dielectric layer 400. The metal layer 201 is coupled to the contact structure 204 via the adhesive layer 203. The contact structure 204 is disposed above the active region 102 of the semiconductor substrate 100 to form electrically contact between the metal layer 210 and the active region 102. In some embodiments, the contact structure 204 is configured to provide an ohmic contact for the active region 102 to the metal layer 201. The adhesive layer 205 is formed to cover the sidewall 210 and the dielectric layer 202, and in contact with the dielectric layer 400 and the capacitor landing pads 300, In some embodiments, the metal layer 201 includes tungsten (W). In some embodiments, the dielectric layer 202 includes nitride, for example, silicon nitride (SiN). In some embodiments, the adhesive layer 203 includes titanium nitride (TiN). In some embodiments, the adhesive layer 205 includes TiN.

The sidewall 210 is configured to isolate the metal layer 201 from the capacitor landing pad 300. The sidewall 210 is a multilayer structure which includes an inner dielectric layer 211, an outer dielectric layer 212, and an air gap 213. The air gap 213 is disposed between the inner dielectric layer 211 and the outer dielectric layer 212. The inner dielectric layer 211 is in contact with the dielectric layer 202, the metal layer 201, the adhesive layer 203, the contact structure 204, the active region 102, and the dielectric layer 400. The outer dielectric layer 212 is in contact with the adhesive layer 205, the adhesive layer 600, the contact structure 700, the isolation region 104, and the dielectric layer 400. A top surface 214 of the sidewall 210 is covered by the dielectric layer 400. In some embodiments, the air gap 213 is configured to decrease the capacitance of the parasitic capacitance in the semiconductor structure 10.

The capacitor landing pad 300 is in contact with the adhesive layer 205 of the bit line structure 200 and the dielectric layer 400. As shown in FIG. 1, the capacitor landing pad 300 has a step shape. In some embodiments, a width W1 of an upper portion of the capacitor landing pad 300 is greater than a width W2 of a bottom portion of the capacitor landing pad 300. In some embodiments, the capacitor landing pad 300 includes W.

The above configuration of the semiconductor structure 10 is provided for illustrated purposes. Various configurations of the semiconductor structure 10 are within the contemplated scope of the present disclosure. For example, in various embodiments, the semiconductor structure 10 includes other suitable material to form the capacitor landing pad 300, the contact structure 700, and the contact structure 204.

In some embodiments, the semiconductor structure 10 is part of a memory device, for example, a dynamic random access memory (DRAM). The memory device includes at least one transistor, the transistor has a gate coupled to a word line of the memory device, a source/drain coupled to a bit line of the memory device, and another source/drain coupled to a capacitor of the memory device. The source/drain coupled to the bit line corresponds to the active region 102 coupled to the bit line structure 200. The source/drain coupled to the capacitor corresponds to the active region 101 coupled to the capacitor landing pads 300. In other embodiments, the semiconductor structure 10 further includes recess (no shown) in the semiconductor substrate 100. The gate of the memory device corresponds to the recess of the semiconductor structure 10.

Figure 2:
FIG. 2 is a flowchart of a method for manufacturing the semiconductor structure shown in FIG. 1 according to some embodiments of the present disclosure.
Figure 3:
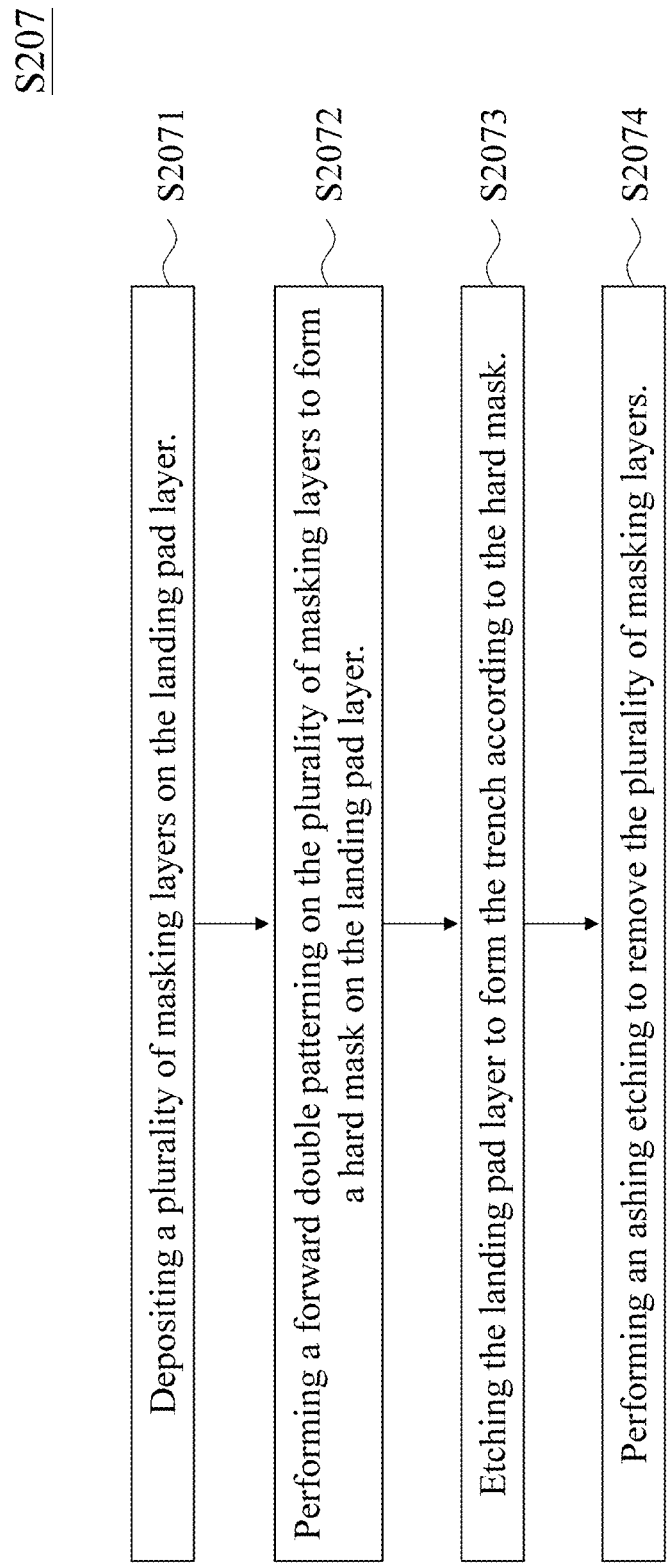
FIG. 3 is a flowchart of operations in the method shown 2 according to some embodiments of the present disclosure.
Figure 4:
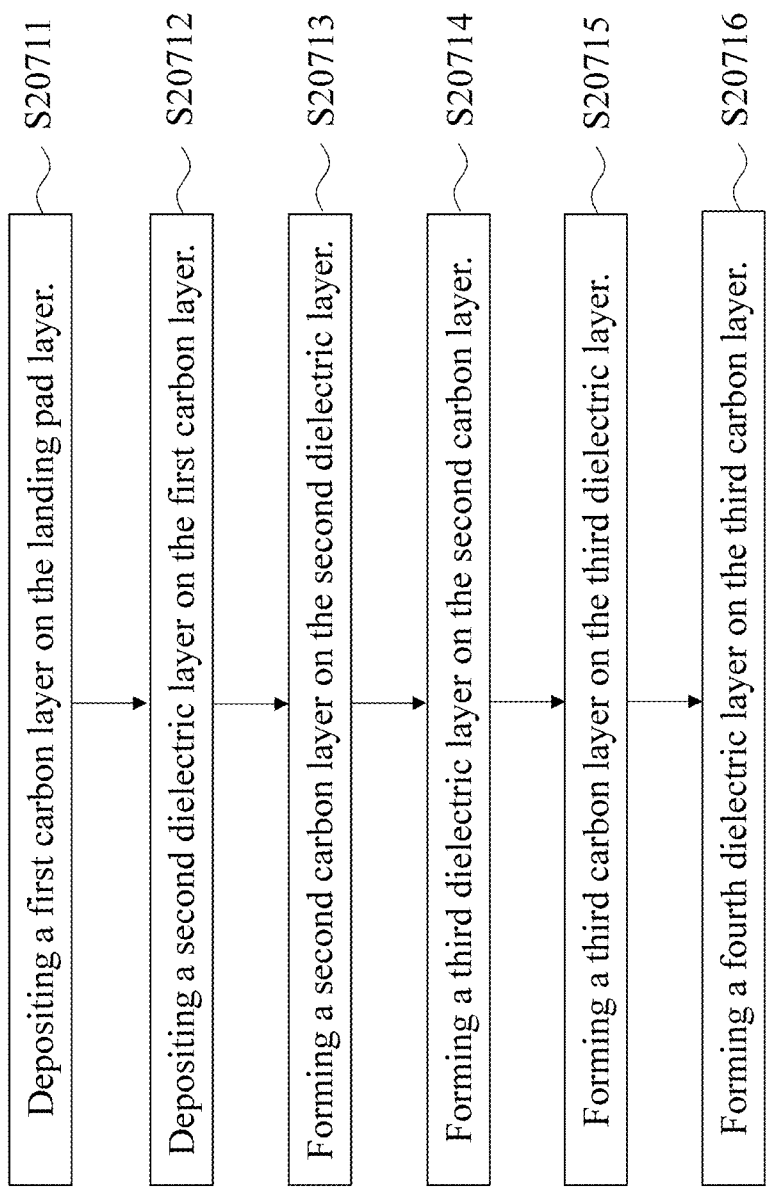
FIG. 4 is a flowchart of operations in the method shown in FIG. 2 according to some embodiments of the present disclosure.
Figure 5:
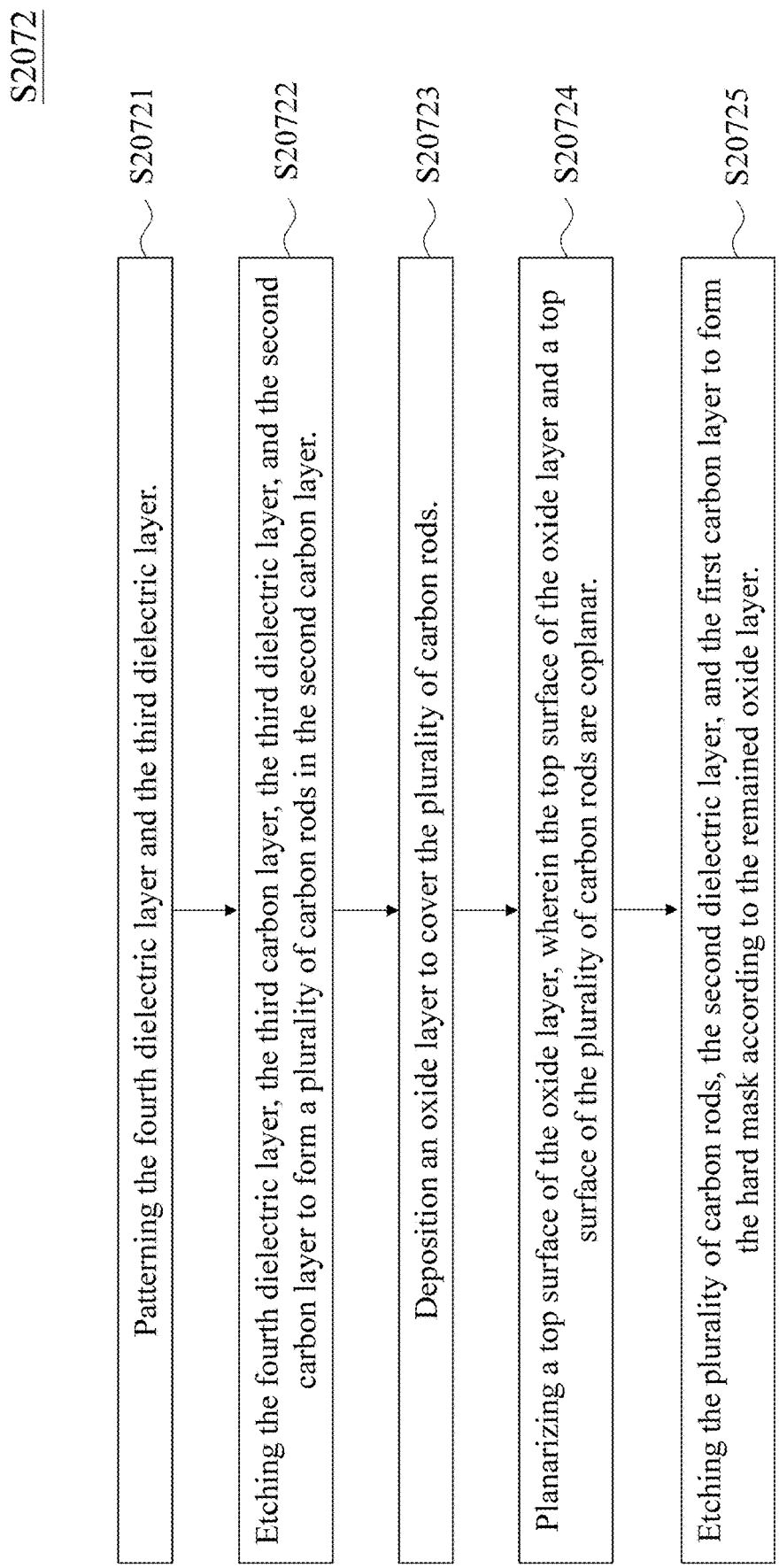
FIG. 5 is a flowchart of operations in the method shown in FIG. 2 according to some embodiments of the present disclosure.
Figure 6:
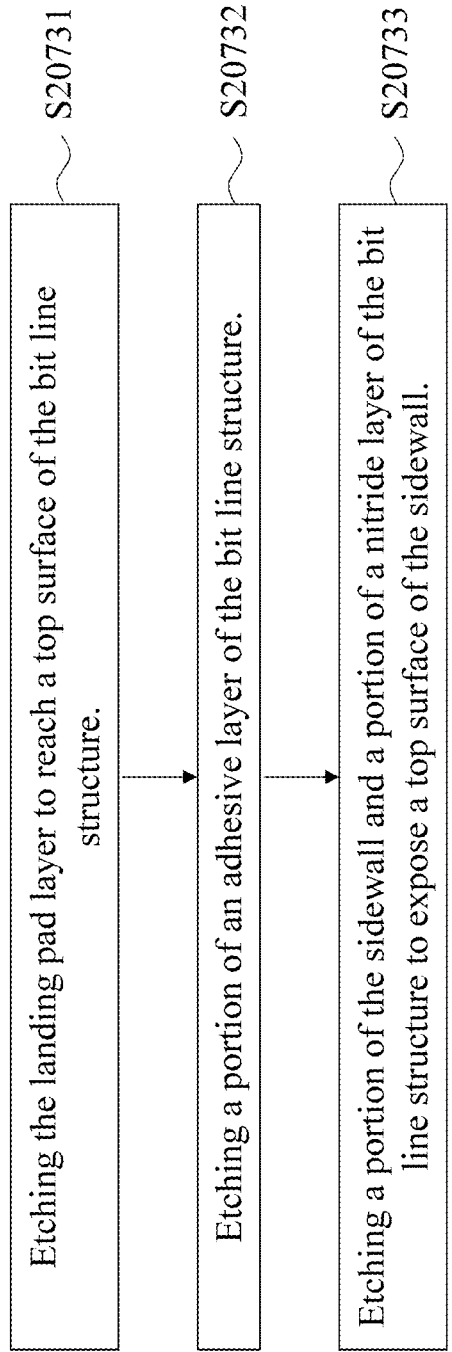
FIG. 6 is a flowchart of operations in the method shown in FIG. 2 according to some embodiments of the present disclosure.
Figure 7:
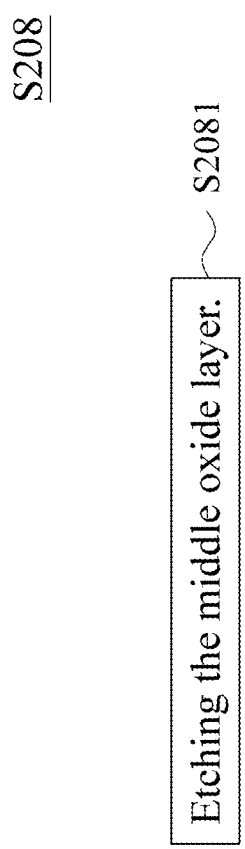
FIG. 7 is a flowchart of an operation in the method shown in FIG. 2 according to some embodiments of the present disclosure.

FIG. 2 is illustrated a flowchart of a method 20 for manufacturing the semiconductor structure 10 shown in FIG. 1 according to some embodiments of the present disclosure. The method 20 includes an operation S201, an operation S202, an operation S203, an operation S204, an operation S205, an operation S206, an operation S207, an operation S208, an operation S209, an operation S210, and an operation S211. FIG. 3 to FIG. 7 are illustrated detailed flowcharts of the operations of the method 20 shown in FIG. 2 according the some embodiments of the present disclosure. FIG. 8 to FIG. 28 are illustrate schematic views in each steps of the manufacturing process of the semiconductor structure 10 shown in FIG. 1 according to some embodiments of the present disclosure. In addition, the method 20 in FIG. 2 to FIG. 7 are described with respect to the schematic view V8 to the schematic view V28 in FIG. 8 to FIG. 28, and the like elements shown in FIG. 8 to FIG. 28 are designated with the same numerals in FIG. 1 to facilitate understanding.

Figure 8:
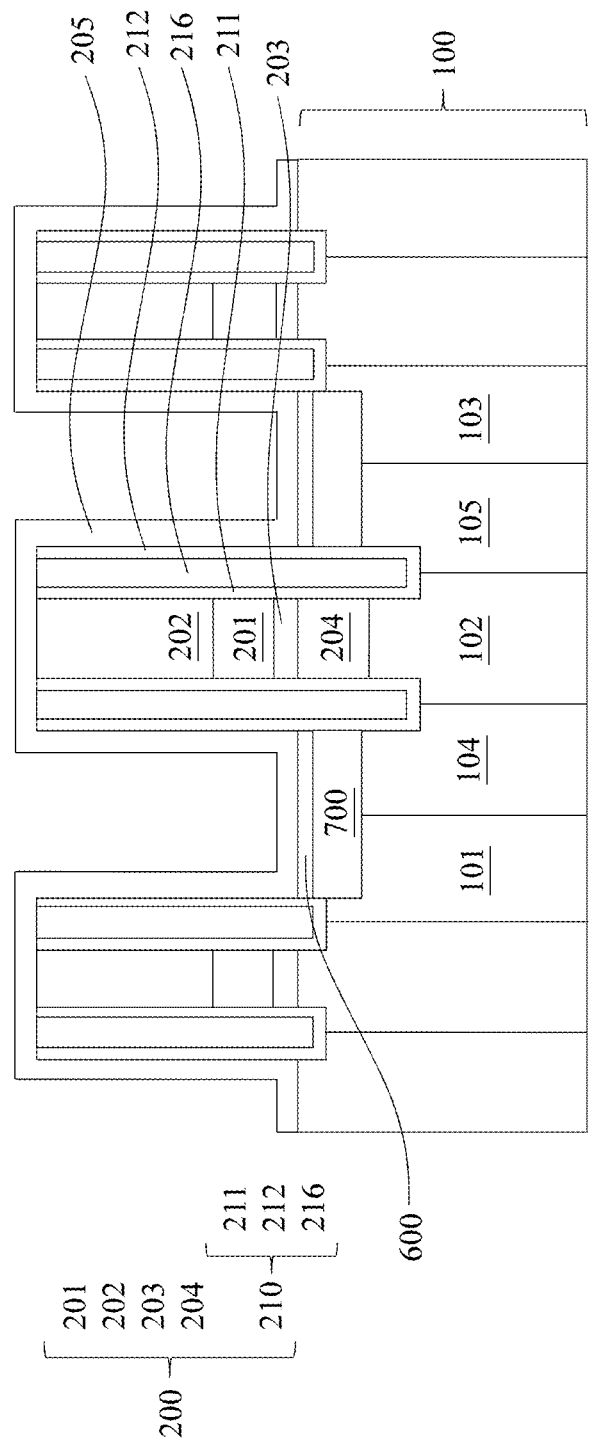
FIG. 8 is a schematic view in a step of the manufacturing process of the semiconductor structure shown in FIG. 1 according to some embodiments of the present disclosure.

Reference is made to FIG. 2 and FIG. 8. In operation S201, the semiconductor substrate 100 is provided. In operation S202, the bit line structure 200 is formed protruding from the semiconductor substrate 100. In operation S203, the landing pad contact structure 700 is formed and coupled to the active region 101 of the semiconductor substrate 100. In operation S204, the cobalt silicide layer 600 (i.e., adhesive layer 600) is formed and coupled the landing pad contact structure 700.

As illustrated in FIG. 8, the schematic view V8 shows that the semiconductor substrate 100 is provided with the active region 101, the active region 102, the active region 103, the isolation region 104, and the isolation region 105. The bit line structure 200 is formed with bit line contact structure 204, the metal layer 201, the dielectric layer 202, the adhesive layer 203, the sidewall 210, and the adhesive layer 205. The sidewall 210 is formed with the inner dielectric layer 211, the outer dielectric layer 212, and an middle oxide layer 216 disposed between the inner dielectric layer 211 and the outer dielectric layer 212.

Compared to the semiconductor structure 10, the sidewall 210 in the schematic view V8 includes the middle oxide layer 216 in the sidewall 210, and does not includes air gap 213 in the sidewall 210. The middle oxide layer 216 would be etched in the later operation to form the air gap 216. The details will be described with respect to the operation S208 below.

Figure 9:
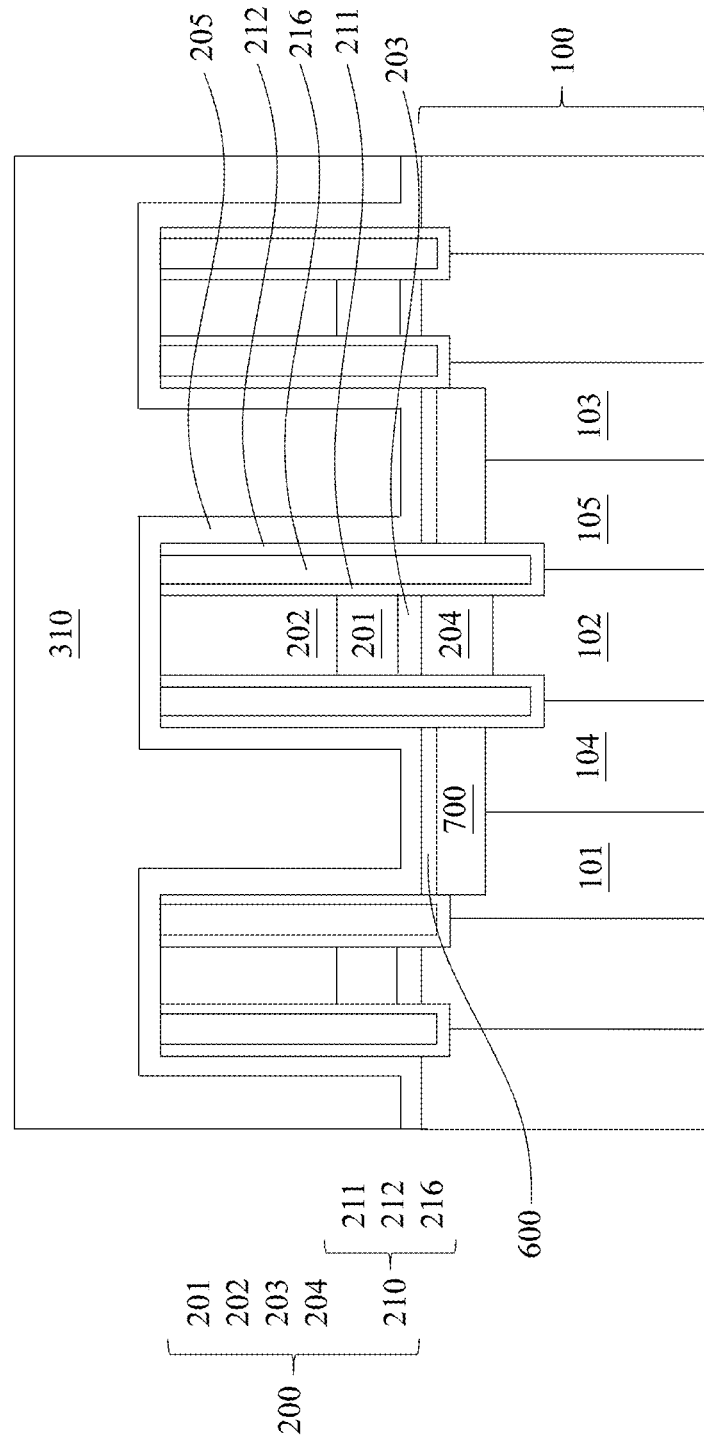
FIG. 9 is a schematic view in a step of the manufacturing process of the semiconductor structure shown in FIG. 1 according to some embodiments of the present disclosure.

Reference is further made to FIG. 9. In operation S205, the landing pad layer 310 is deposited to cover the bit line structure 200. In operation S206, the top surface of the land pad layer 310 is planarized. As illustrated in FIG. 9, the schematic view V9 shows that the landing pad layer 310 covers the contour of the bit line structure 200. After planarization, the landing pad layer 310 has a substantially flat top surface. The landing pad layer 310 will be etched in the later operation to form the capacitor landing pads 300. Therefore, the landing pad layer 310 and the capacitor landing pads 300 have the same material.

Reference is further made to FIG. 3 and FIG. 10 to FIG. 24. In operation S207, trenches TC in the landing pad layer 310 is formed for forming the capacitor landing pads 300. In some embodiments, the operation S207 includes an operation S2071, an operation S2072, an operation S2073, and an operation S2074.

In operation S2071, masking layers ML are deposited on the landing pad layer 310. In operation S2072, a forward double patterning is performed on the masking layers ML to form a hard mask HM on the landing pad layer 310. In operation S2073, the landing pad layer 310 is etched to form the trenches TC according to the hard mask HM. In operation S2074, an ashing etching is performed to remove the masking layers ML.

In some embodiments, the masking layers ML includes carbon layers and dielectric layers alternatively disposed. The masking layers ML are configured to be etched so as to form the hard mask HK for the formation of the trenches TC. In some embodiments, the operation S2071 includes an operation S20711, an operation S20712, an operation S20713, an operation S20714, an operation S20715, and an operation S20716.

Figure 10:
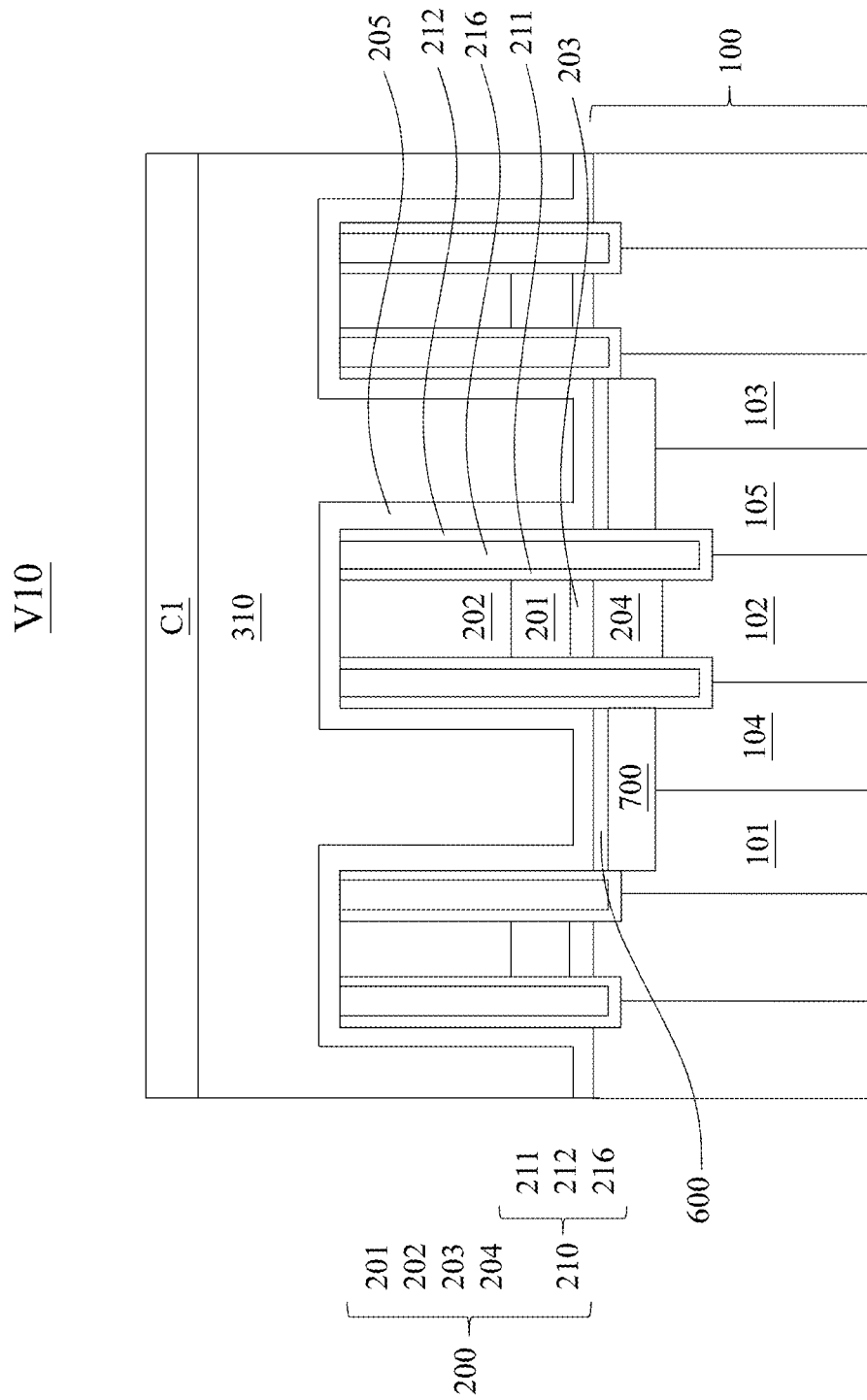
FIG. 10 is a schematic view in a step of the manufacturing process of the semiconductor structure shown in FIG. 1 according to some embodiments of the present disclosure.

In operation S20711, a carbon layer C1 is deposited on the landing pad layer 310. In FIG. 10, the schematic view V11 shows the deposition of the carbon layer C1 on the landing pad layer 310. In some embodiments, the carbon layer C1 has a height which is substantially equal to 90 nm.

Figure 11:
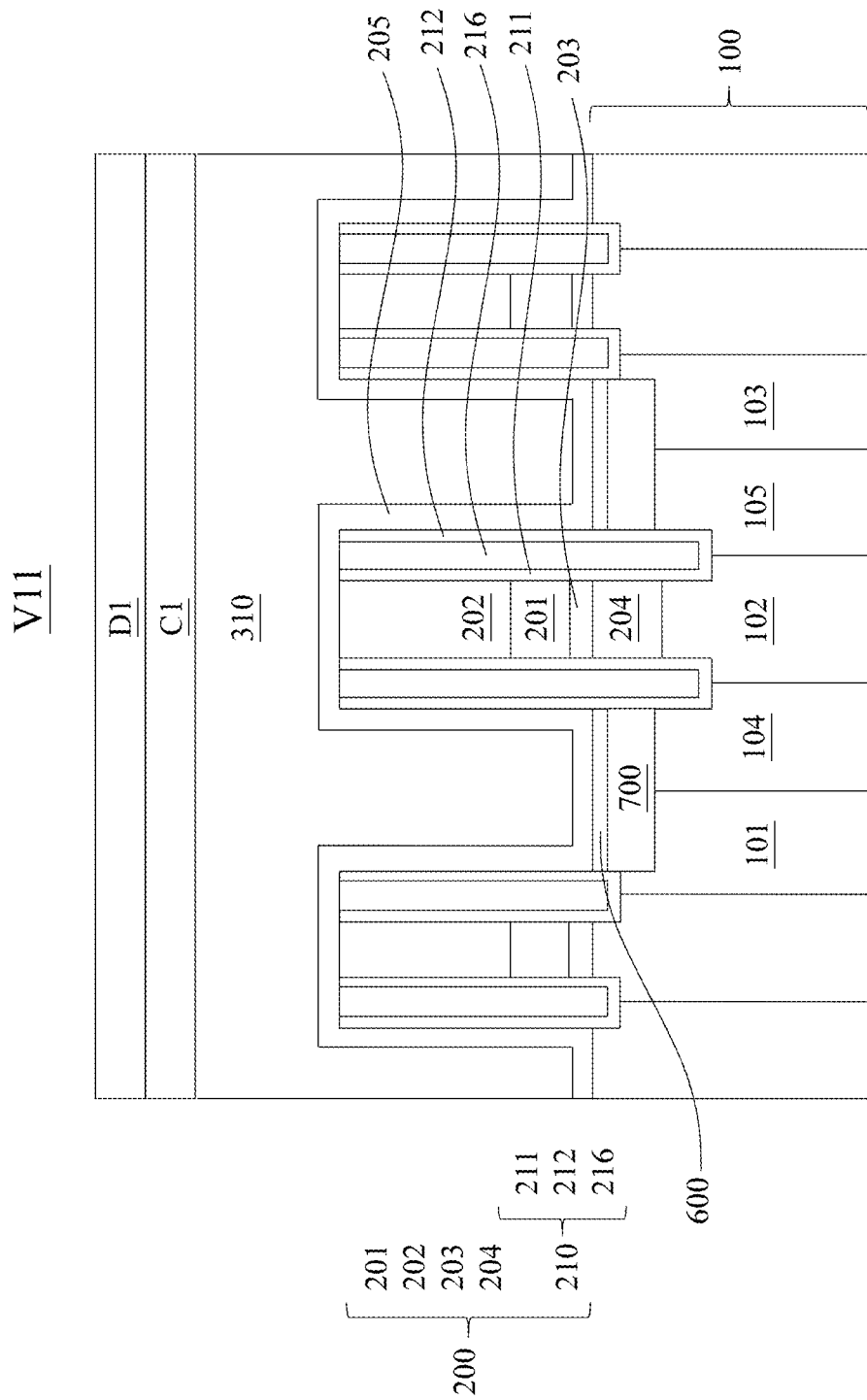
FIG. 11 is a schematic view in a step of the manufacturing process of the semiconductor structure shown in FIG. 1 according to some embodiments of the present disclosure.

In operation S20712, a dielectric layer D1 is deposited on the carbon layer C1. In FIG. 11, the schematic view V11 shows the deposition of the dielectric layer D1 on the carbon layer C1. In some embodiments, the dielectric layer D1 includes SiN.

Figure 12:
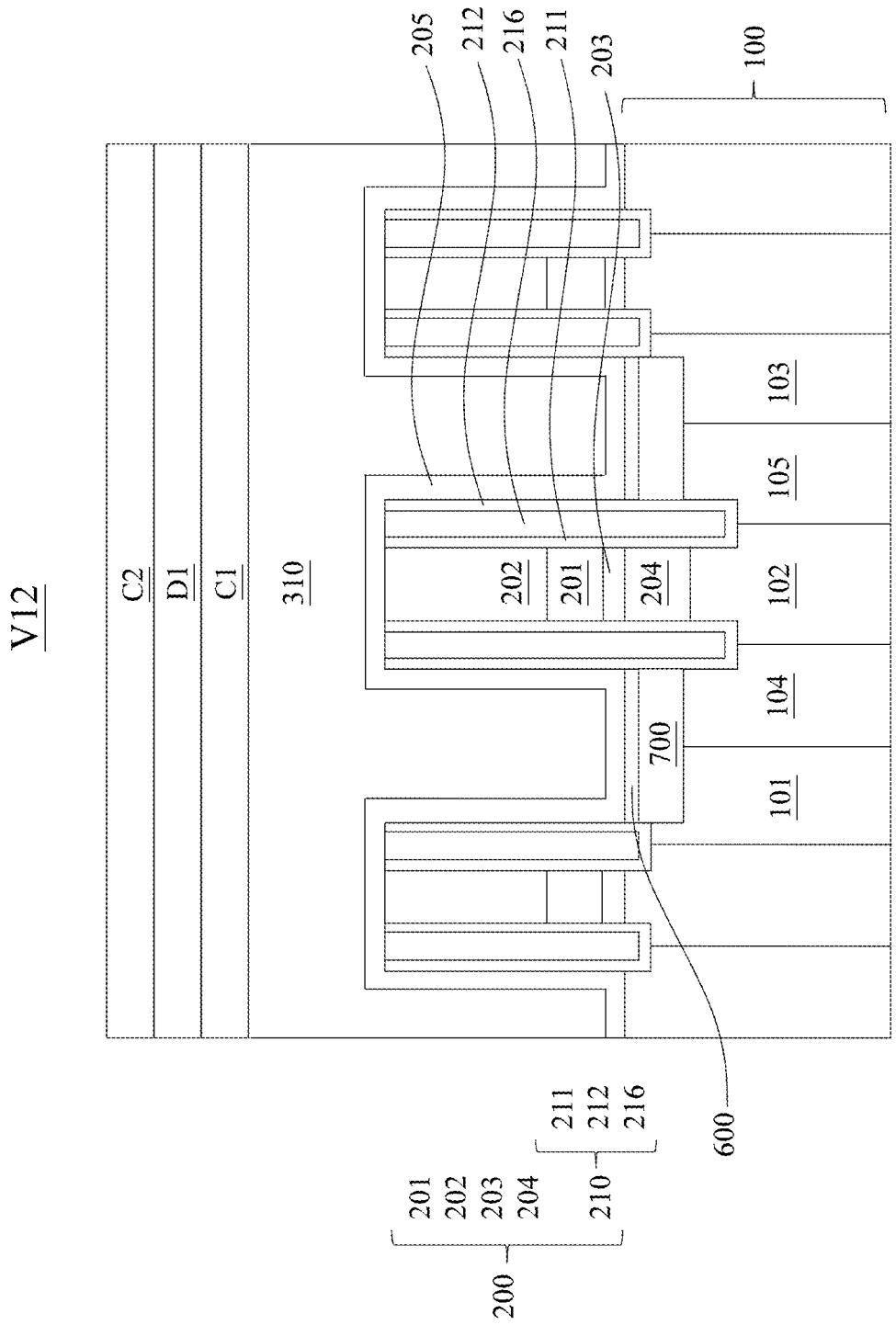
FIG. 12 is a schematic view in a step of the manufacturing process of the semiconductor structure shown in FIG. 1 according to some embodiments of the present disclosure.

In operation S20713, a carbon layer C2 is deposited on the dielectric layer D1. In FIG. 12, the schematic view V12 shows the deposition of the carbon layer C2 on the dielectric layer D1.

Figure 13:
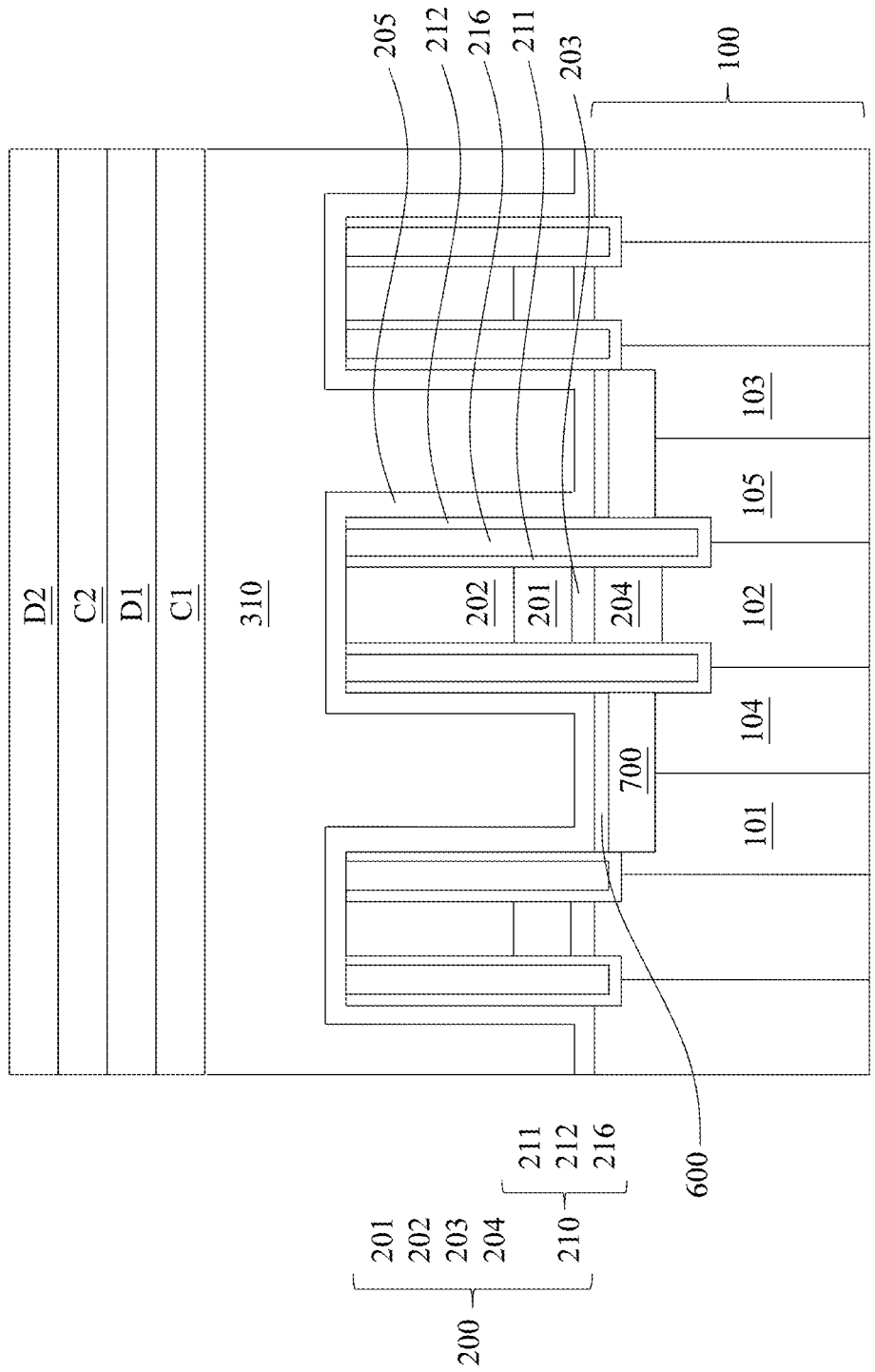
FIG. 13 is a schematic view in a step of the manufacturing process of the semiconductor structure shown in FIG. 1 according to some embodiments of the present disclosure.

In operation S20714, a dielectric layer D2 is deposited on the carbon layer C2. In FIG. 13, the schematic view V13 shows the deposition of the dielectric layer D2 on the carbon layer C2. In some embodiments, the dielectric layer D2 includes S1. In some embodiments, the dielectric layer D2 is dielectric anti-reflective coating.

Figure 14:
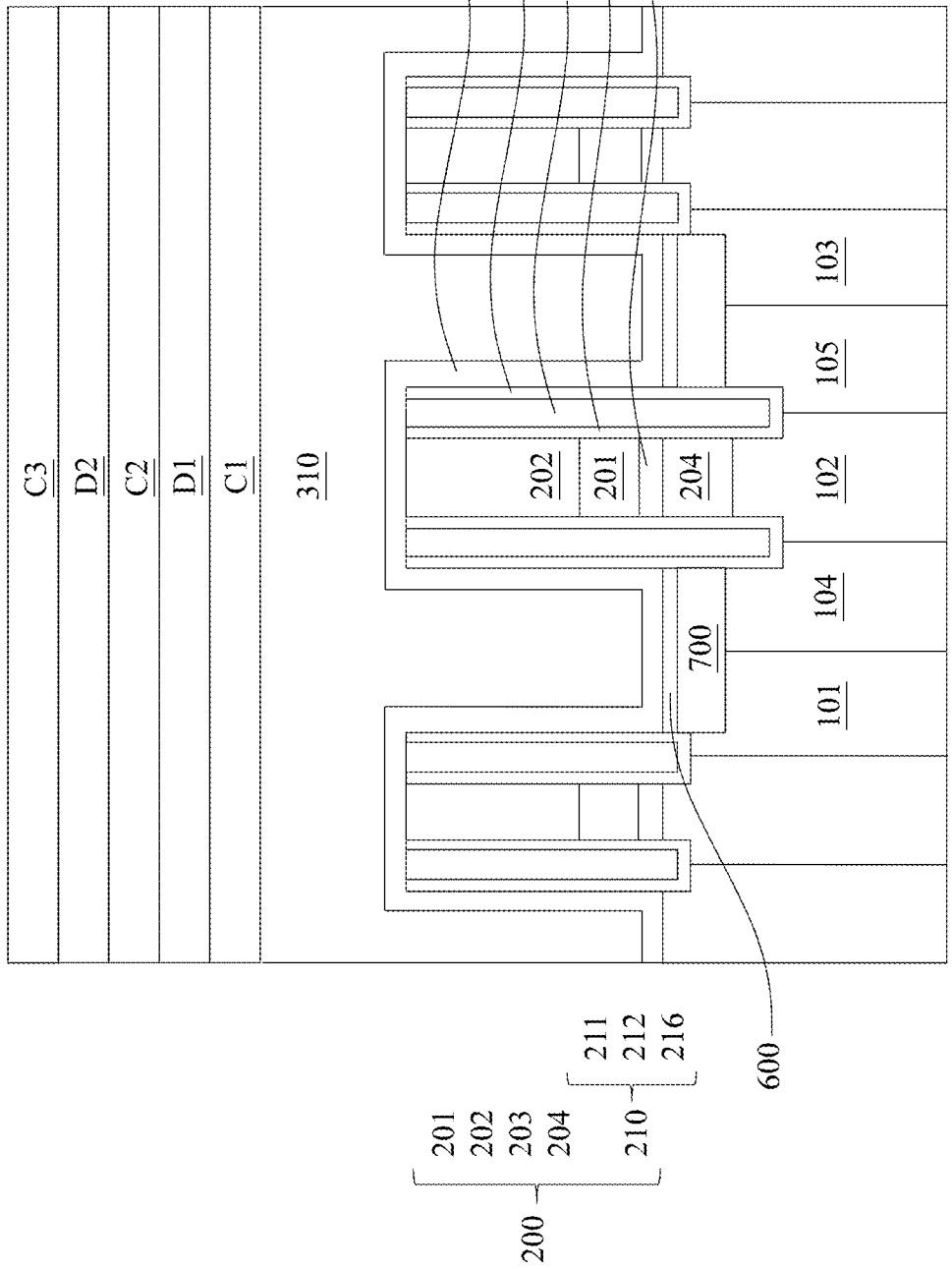
FIG. 14 is a schematic view in a step of the manufacturing process of the semiconductor structure shown in FIG. 1 according to some embodiments of the present disclosure.

In operation S20715, a carbon layer C3 is deposited on the dielectric layer D2. In FIG. 14, the schematic view V14 shows the deposition of the carbon layer C3 on the dielectric layer D2.

Figure 15:
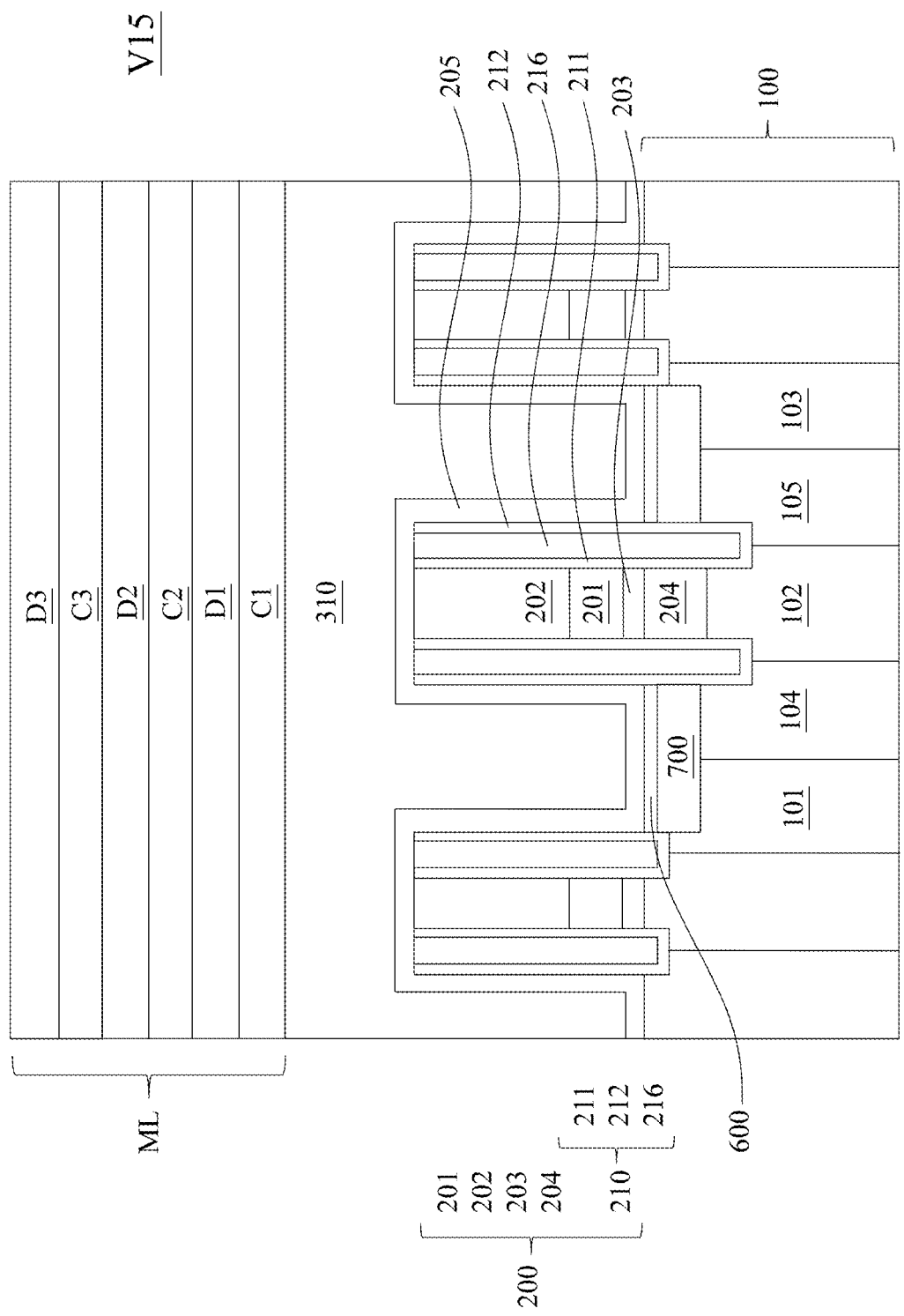
FIG. 15 is a schematic view in a step of the manufacturing process of the semiconductor structure shown in FIG. 1 according to some embodiments of the present disclosure.

In operation S20716, a dielectric layer D3 is deposited on the carbon layer C3. In FIG. 15, the schematic view V15 shows the deposition of the dielectric layer D3 on the carbon layer C3, in some embodiments, the dielectric layer D3 includes O. In some embodiments, the dielectric layer D3 is dielectric anti-reflective coating.

In this embodiments, the masking layer ML includes the carbon layer C1, the carbon layer C2, the carbon layer (73, the dielectric layer D1, the dielectric layer D2, and the dielectric layer D3. After the masking layers ML are formed, the operation S2072 is performed. In some embodiments, the operation S2072 includes an operation S20721, an operation S20722, an operation S20723, an operation S20724, and an operation S20725.

Figure 16:
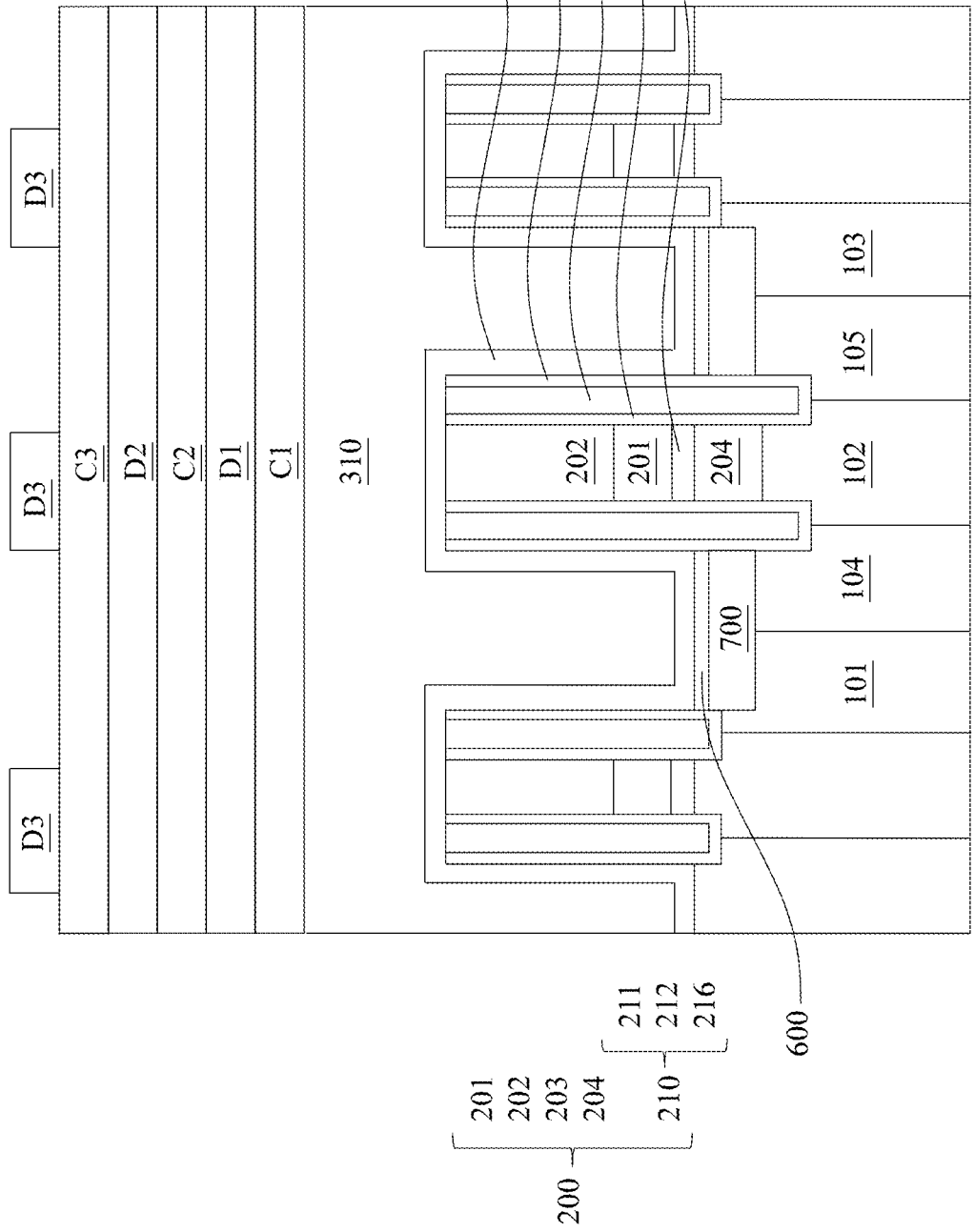
FIG. 16 is a schematic view in a step of the manufacturing process of the semiconductor structure shown in FIG. 1 according to some embodiments of the present disclosure.
Figure 17:
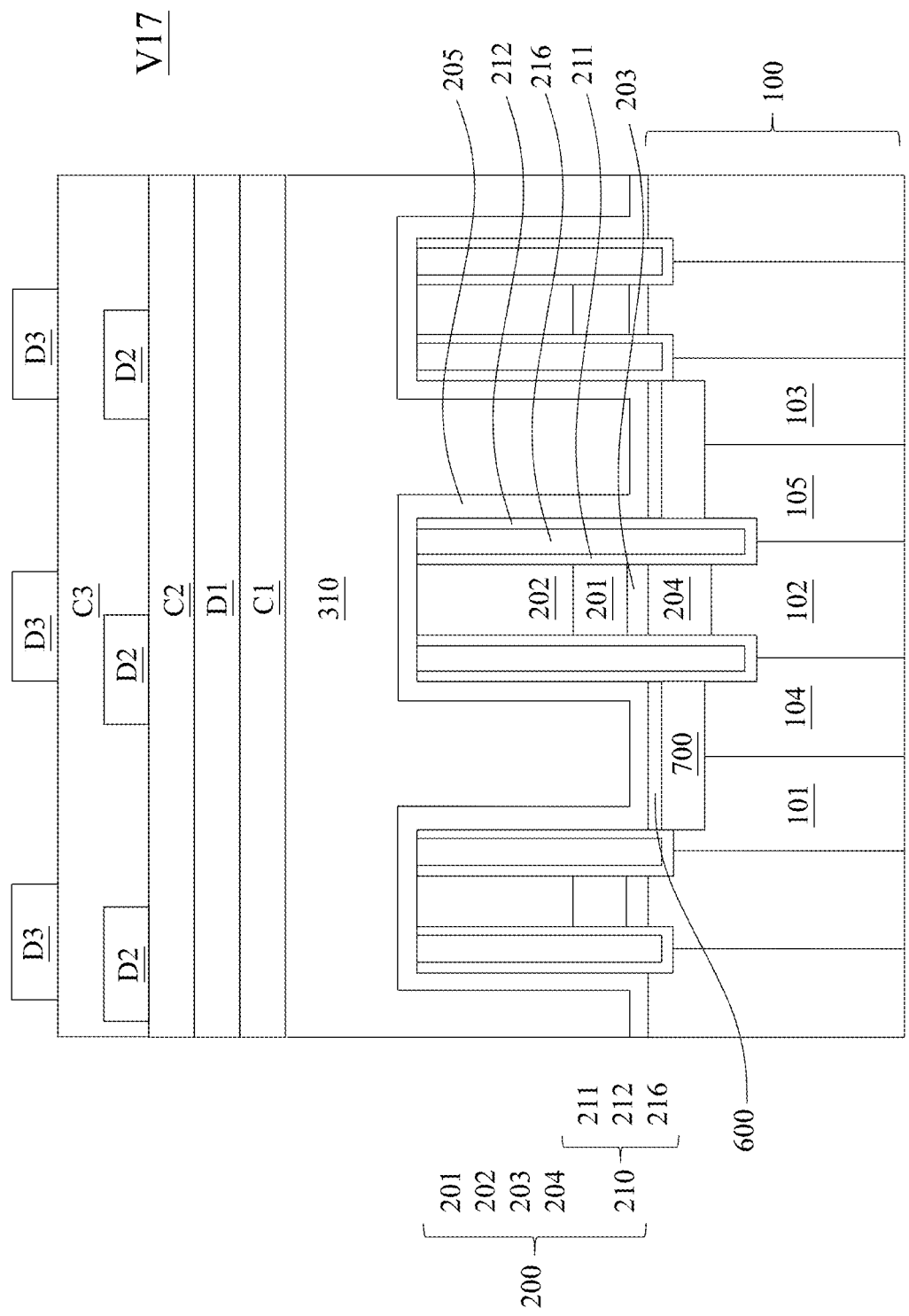
FIG. 17 is a schematic view in a step of the manufacturing process of the semiconductor structure shown in FIG. 1 according to some embodiments of the present disclosure.

In operation S20721, the dielectric layer D3 and the dielectric layer S2 are patterned. In FIG. 16, the schematic view V16 shows the dielectric layer D3 is patterned. In FIG. 17, the schematic view V17 shows the dielectric layer D2 is patterned. In some embodiments, the patterned dielectric layer D2 and the patterned dielectric layer D3 are not aligned. The configuration of the patterned dielectric layer D2 and the patterned dielectric layer D3 is provided for illustrative purposes but not limited thereto.

Figure 18:
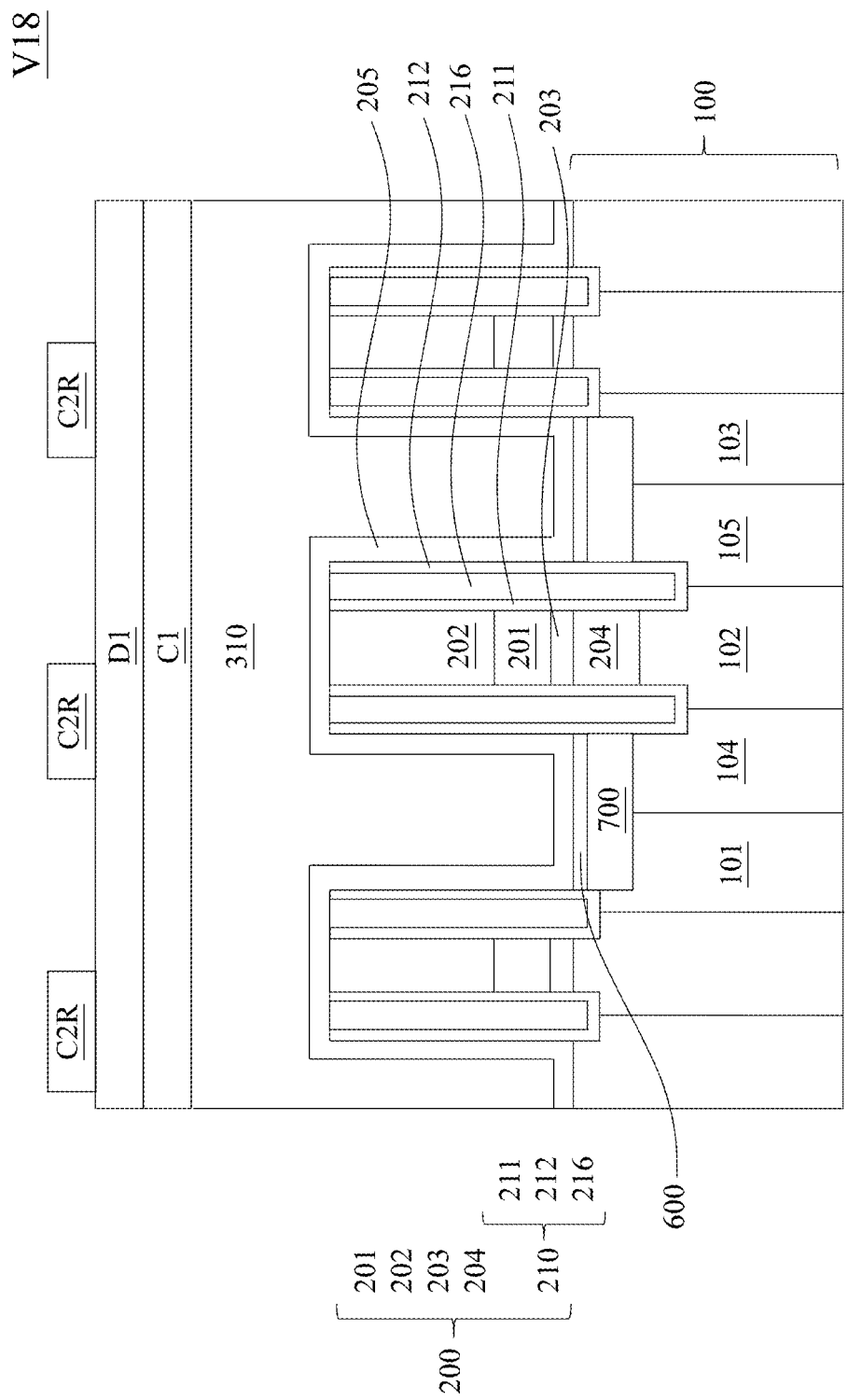
FIG. 18 is a schematic view in a step of the manufacturing process of the semiconductor structure shown in FIG. 1 according to some embodiments of the present disclosure.
Figure 19:
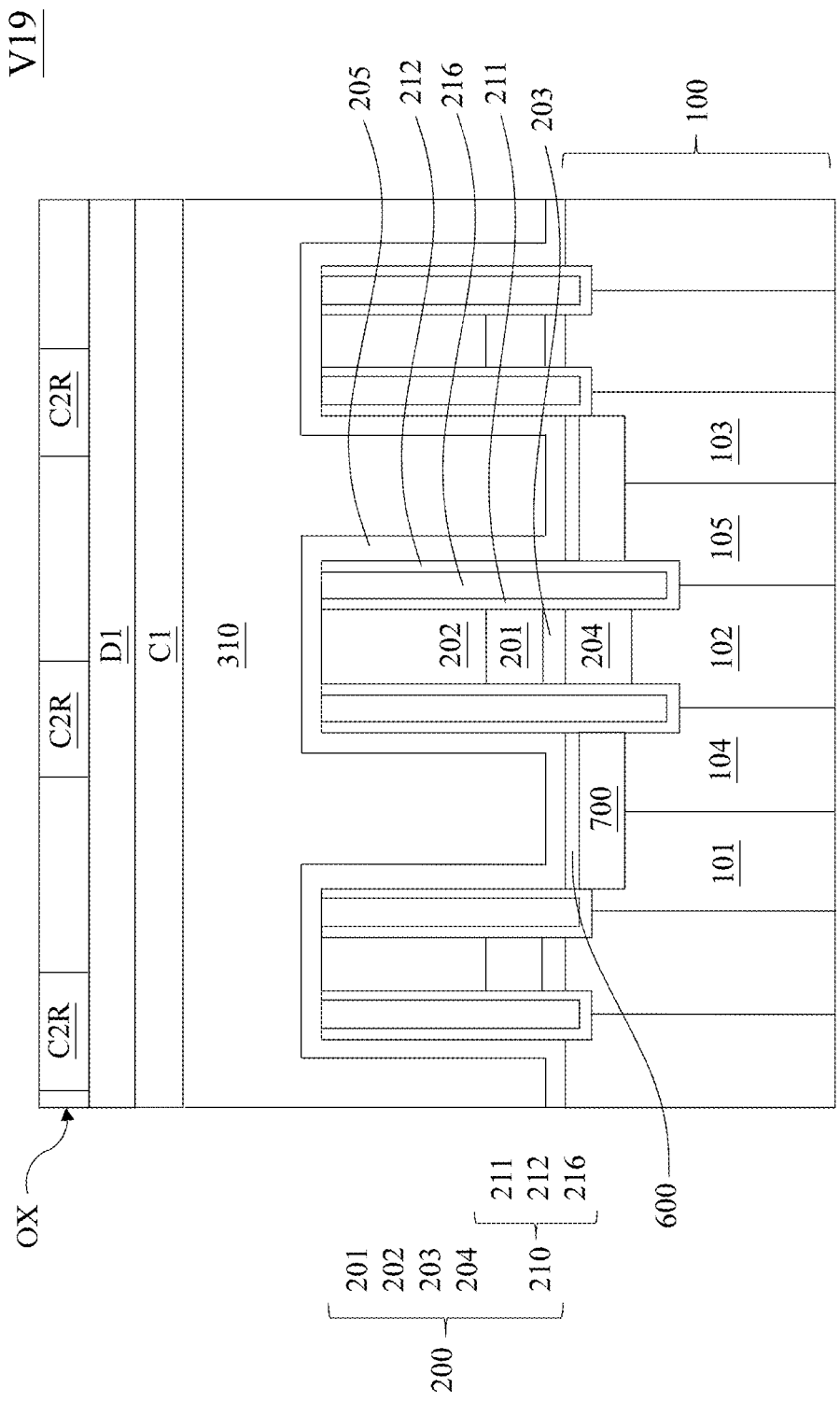
FIG. 19 is a schematic view in a step of the manufacturing process of the semiconductor structure shown in FIG. 1 according to some embodiments of the present disclosure.

In operation S20722, the dielectric layer D3, the dielectric layer D2, the carbon layer C3, the carbon layer C2 are etched to form carbon rods C2R in the carbon layer C2 according to the patterned dielectric layer D2 and the patterned dielectric layer D3. In FIG. 18, the schematic view V18 shows the carbon rods C2R after the carbon layer C2, the carbon layer C3, the dielectric layer D2, and the dielectric layer D3 being etched.

In operation S20723, an oxide layer OX is deposited to cover the carbon rods C2R. In operation S20724, a top surfhce of the oxide layer OX is planarized. In some embodiments, the operation S20724 is performed by chemical mechanical polishing (CMP). In other embodiments, the operation S2.0724 is performed by etching back. In some embodiments, the top surface of the oxide layer OX and a top surface of the carbon rods C2R are coplanar after the operation S20724, In FIG. 19, the schematic view V19 shows the oxide layer OX filled between the carbon rods C2R, and the oxide layer OX and the carbon rods C2R are coplanar after the planarization.

Figure 20:
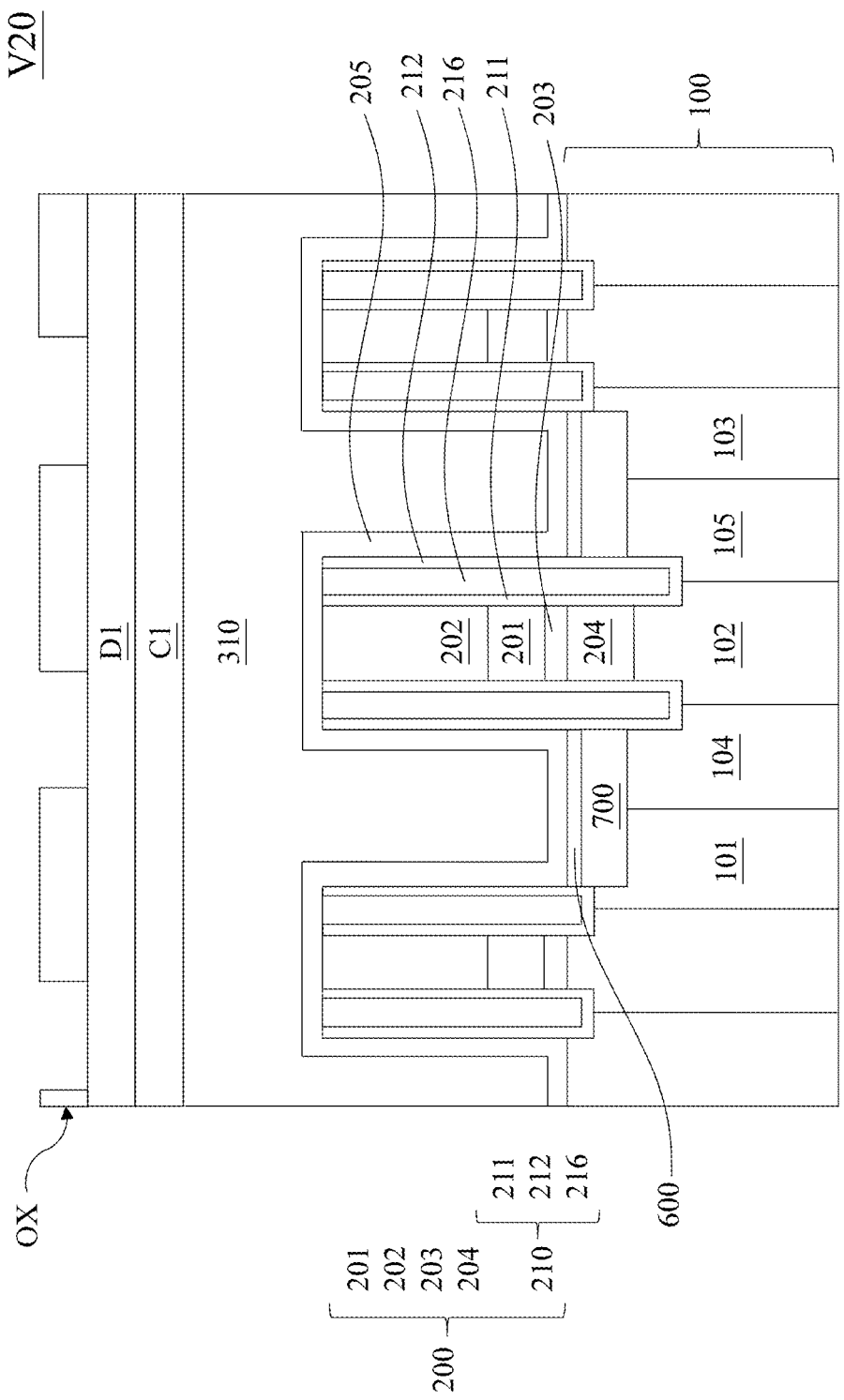
FIG. 20 is a schematic view in a step of the manufacturing process of the semiconductor structure shown in FIG. 1 according to some embodiments of the present disclosure.
Figure 21:
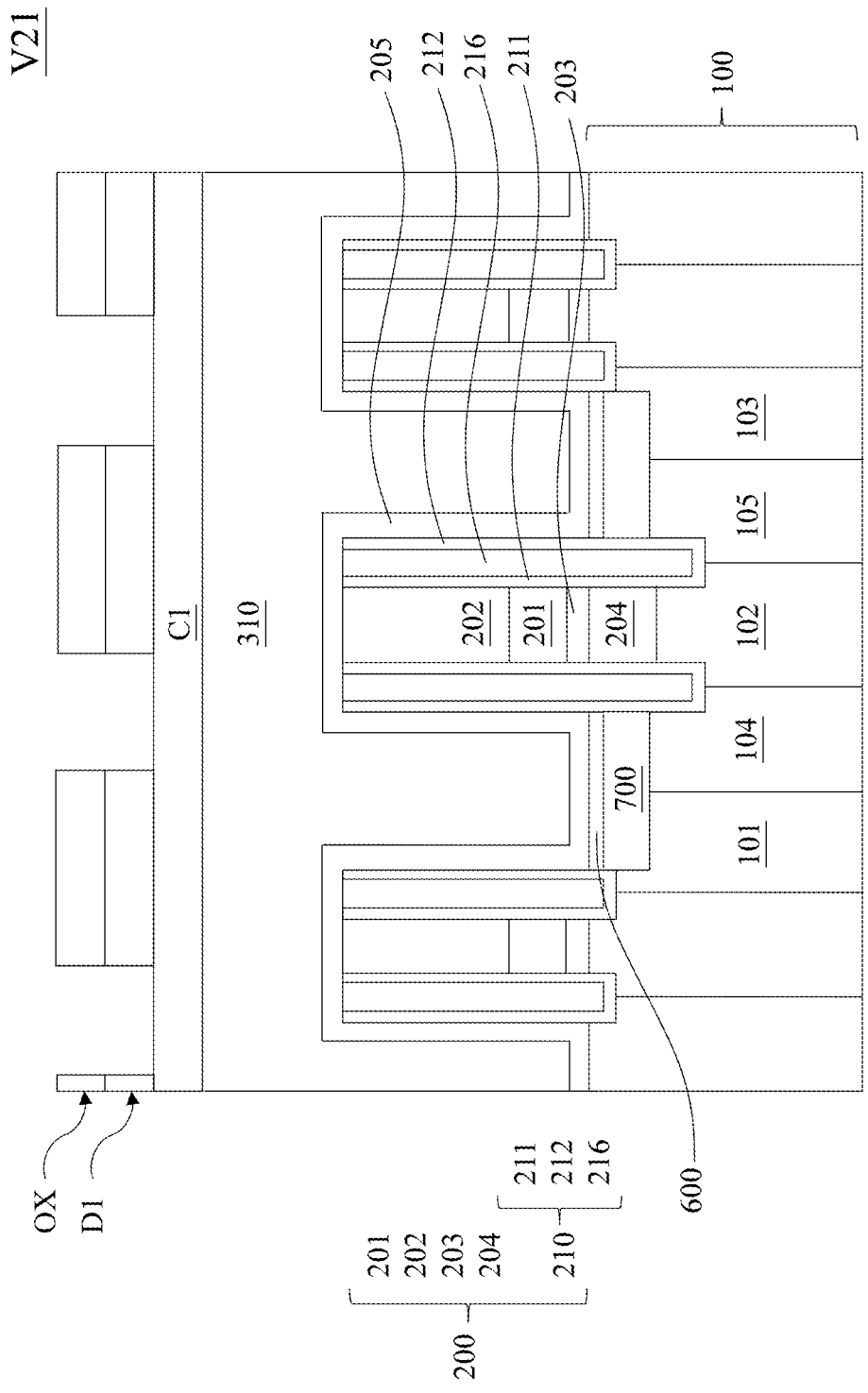
FIG. 21 is a schematic view in a step of the manufacturing process of the semiconductor structure shown in FIG. 1 according to some embodiments of the present disclosure.
Figure 22:
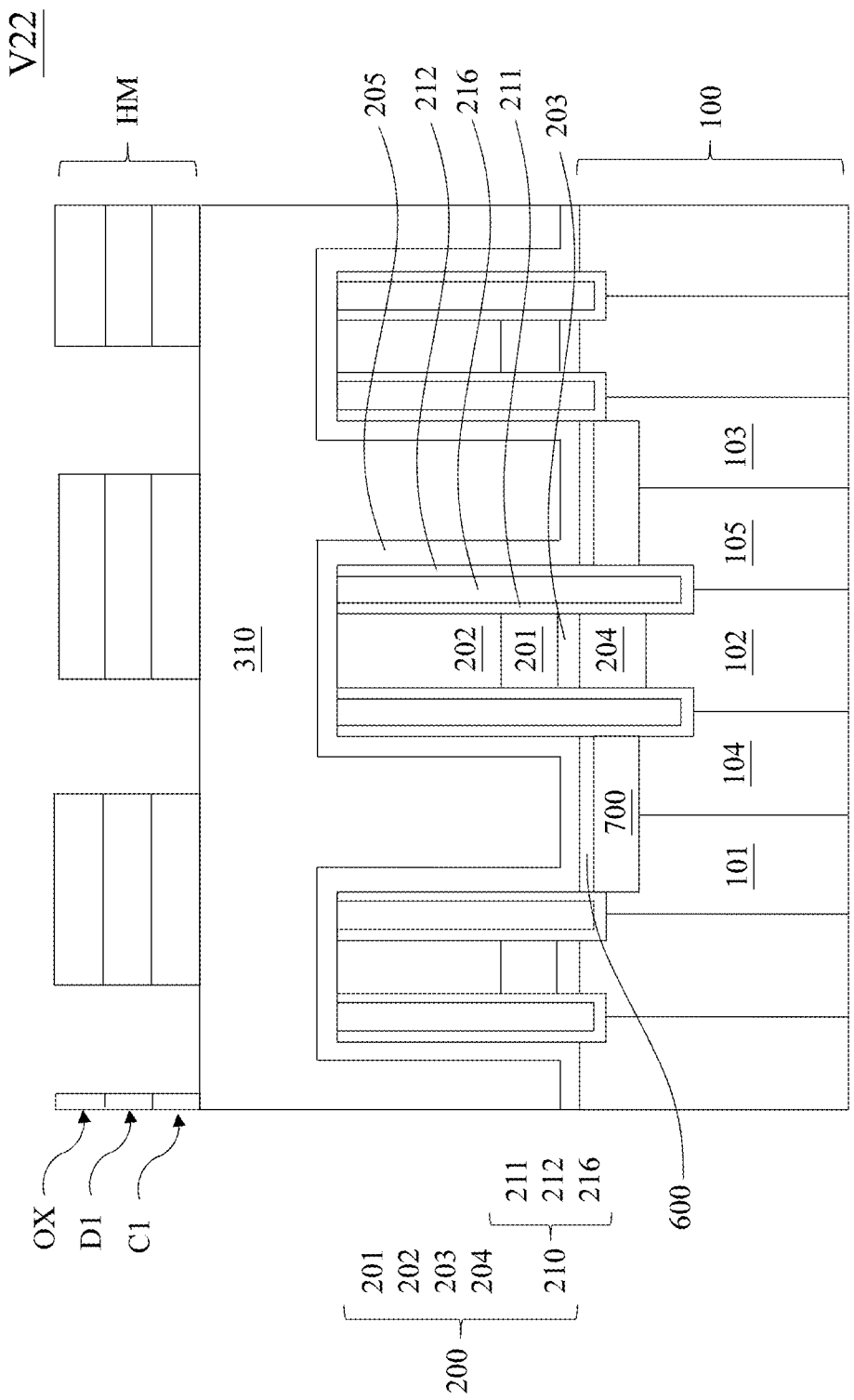
FIG. 22 is a schematic view in a step of the manufacturing process of the semiconductor structure shown in FIG. 1 according to some embodiments of the present disclosure.

In operation S20725, the carbon rods C2R, the dielectric layer D2, and the carbon layer C1 are etched to form the hard mask HM according to the remained oxide layer OX. The carbon rods C2R are etched during the operation S20725. In addition, a portion of the dielectric layer D1 and a portion of the carbon C1 corresponding to the carbon rods C2R are also etched during the operation S20725. In FIG. 20, the schematic view V20 shows that the carbon rods C2R are removed and the oxide layer OX are remained on the dielectric layer D1. In FIG. 21, the schematic view V21 shows the etched dielectric layer D1 corresponding to the etched carbon rods C2R. In FIG. 22, the schematic view V22 shows the etched carbon layer C1 corresponding to the etched carbon rods C2R and the etched dielectric layer D1. More specifically, the etched dielectric layer D1 and the etched carbon layer C1 are aligned with the carbon rods C2R. The hard mask HM thus includes the remained oxide layer OX in the upper portion, the remained dielectric layer D1 in the middle portion, and the remained carbon layer C1 in the bottom portion.

After the hard mask HM is formed, the operation S2073 is performed. In some embodiments, the operation S2073 includes an operation S20731, an operation S20732, and an operation S20733. In some embodiments, the trenched TC are partially aligned with the bit line structure 200. More specifically, the landing pad layer 310 being etched (i.e., the positions where the trenches TC will be located) overlaps a portion of bit line structure 200. Therefore, during etching the landing pad layer 310, the portion of the bit line structure 200 will be etched.

Figure 23:
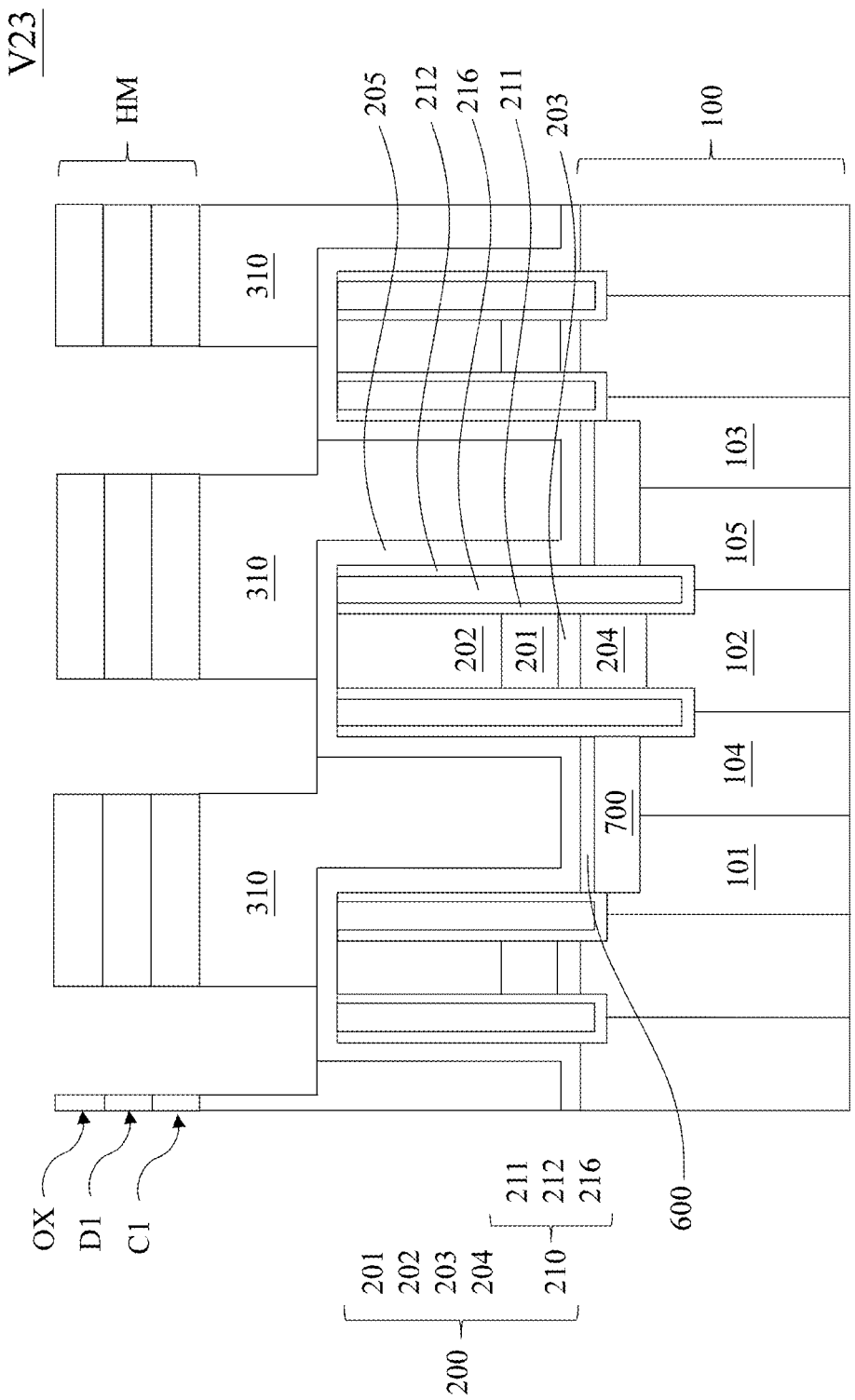
FIG. 23 is a schematic view in a step of the manufacturing process of the semiconductor structure shown in FIG. 1 according to some embodiments of the present disclosure.

In operation S20731, the landing pad layer 310 is etched to reach a top surface of the bit line structure 200. In FIG. 23, the schematic view V23 shows that the landing pad layer 310 is etched to have a bottom reaching the bit line structure 200.

Figure 24:
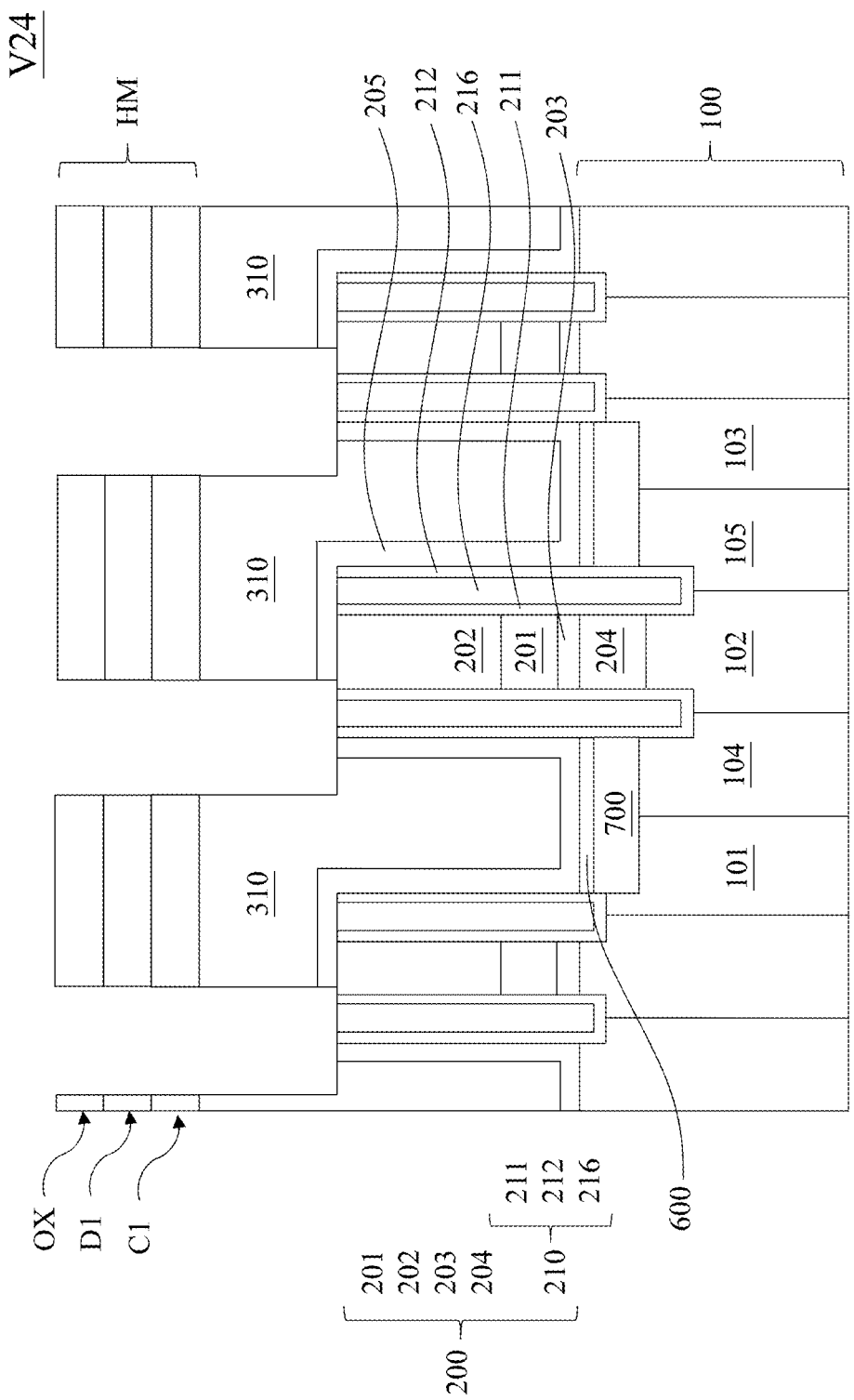
FIG. 24 is a schematic view in a step of the manufacturing process of the semiconductor structure shown in FIG. 1 according to some embodiments of the present disclosure.

In operation S20732, the adhesive layer 205 of the bit line structure 200 is etched. In FIG. 24, the schematic view V24 shows a portion of adhesive layer 205 is etched.

Figure 25:
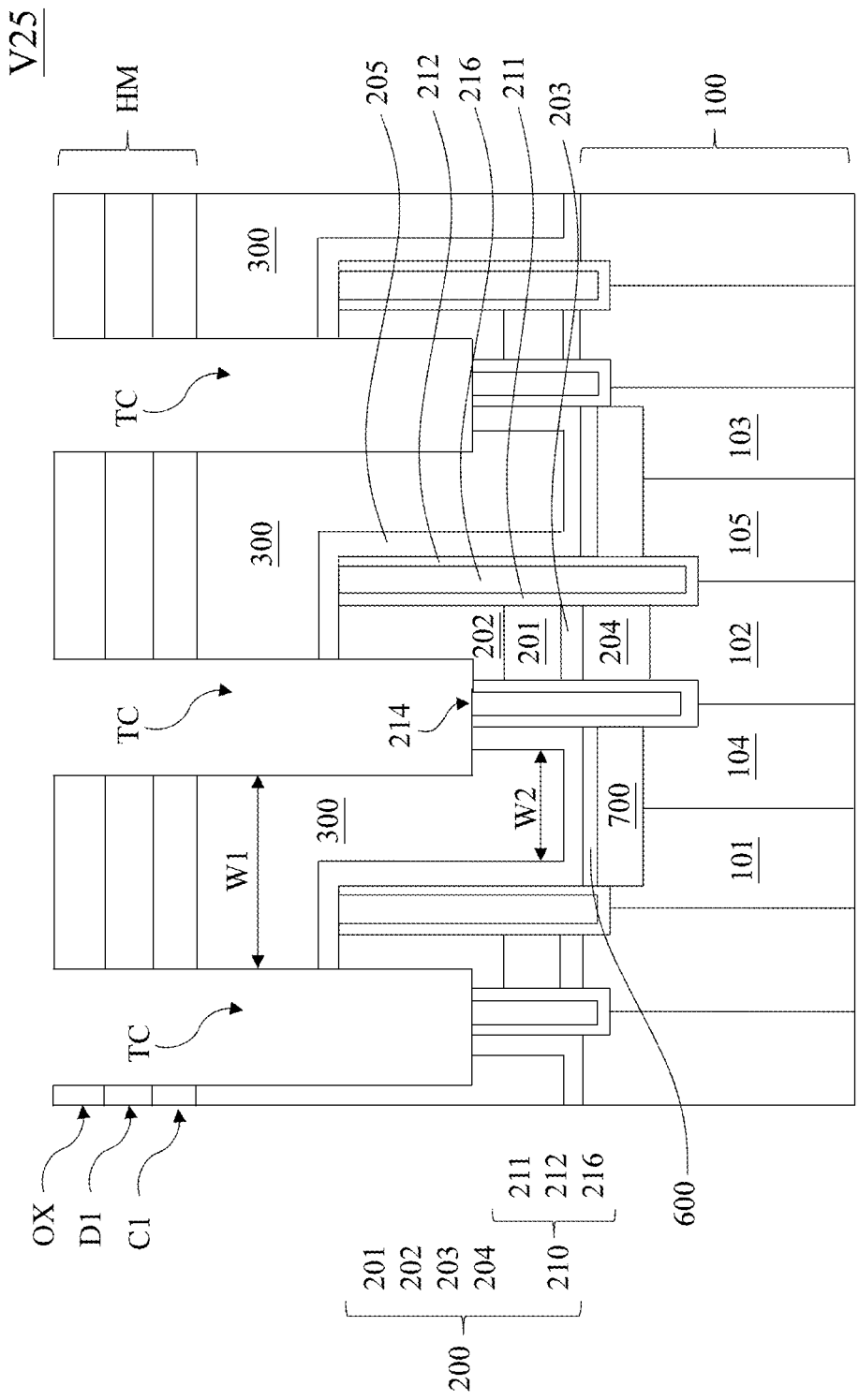
FIG. 25 is a schematic view in a step of the manufacturing process of the semiconductor structure shown in FIG. 1 according to some embodiments of the present disclosure.

In operation S20733, a portion sidewall 210 and a portion of the dielectric layer 202 of the bit line structure 200 are etched to expose the top surface 214 of the sidewall 210 of the bit line structure 200. In FIG. 25, the schematic view V25 shows that the capacitor landing pads 300 are formed after the landing pad layer 310 is etched. Further, the portion of sidewall 210 and the portion of dielectric layer 202 are etched. The top surface 210 of the sidewall 210 is then exposed. The top surface 214 includes three sections which are a top surface of the inner dielectric layer 211, a top surface of the outer dielectric layer 212, and a top surface of the middle oxide layer 216.

Figure 26:
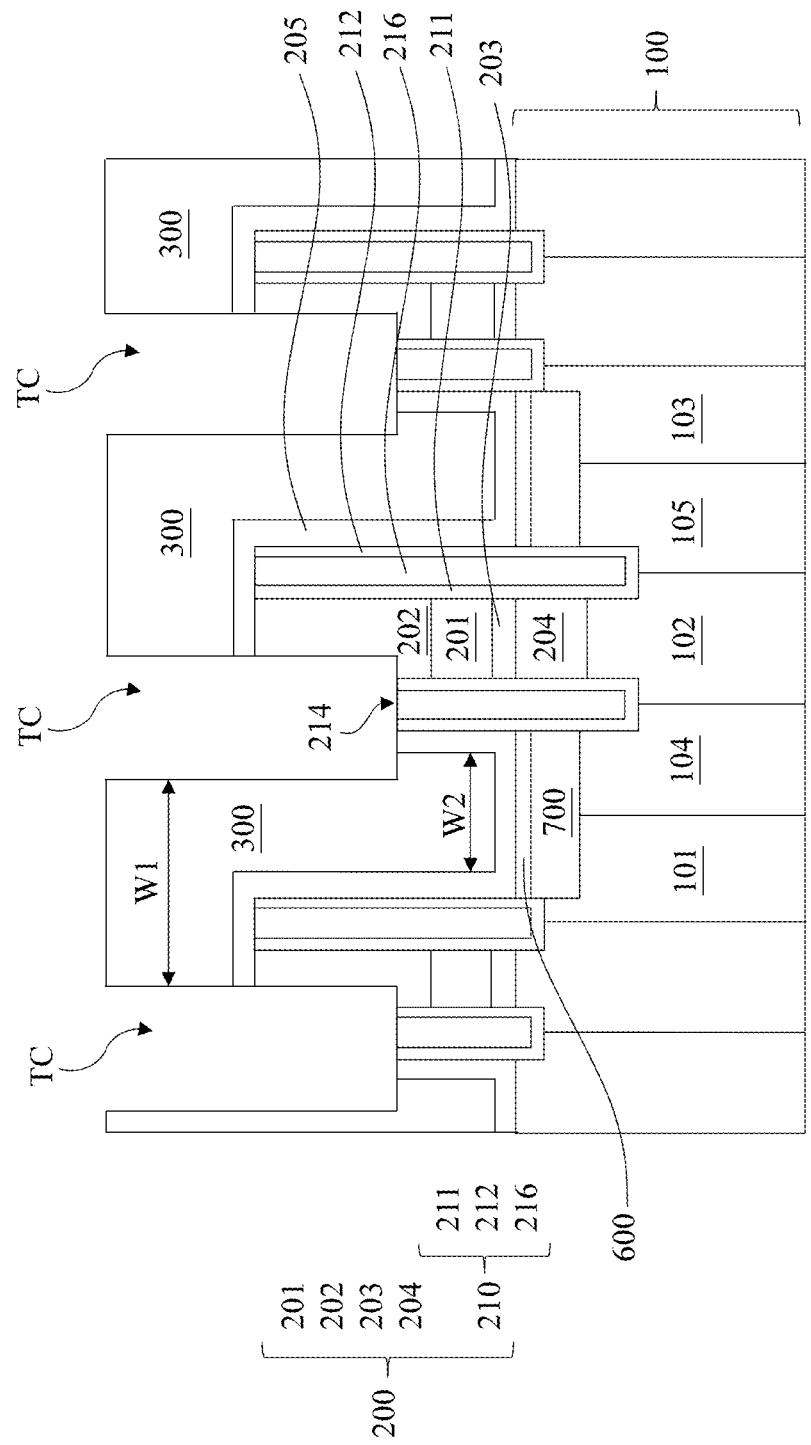
FIG. 26 is a schematic view in a step of the manufacturing process of the semiconductor structure shown in FIG. 1 according to some embodiments of the present disclosure.

After the operations S20731, S20732, and 207233 are perfbnned, the trenches TC and the capacitor landing pads 300 are formed. The hard mask HM (i.e., the remained masking layers ML) are removed by the operation S2074 as illustrated in FIG. 26. In FIG. 26, the schematic view V26 also shows that the formed capacitor landing pads 300 have the width W1 of the upper portion greater than the width W2 of the bottom portion. The width W1 is associated the dimension of the hard mask HM. The dimension of the hard mask HM is further associated with the dimension of the carbon rods C2R. The dimension of the carbon rods C2R is controlled by the forward double patterning performed in the operation S2072. Alternatively stated, the width W1 is controlled by the operation S2072.

Figure 27:
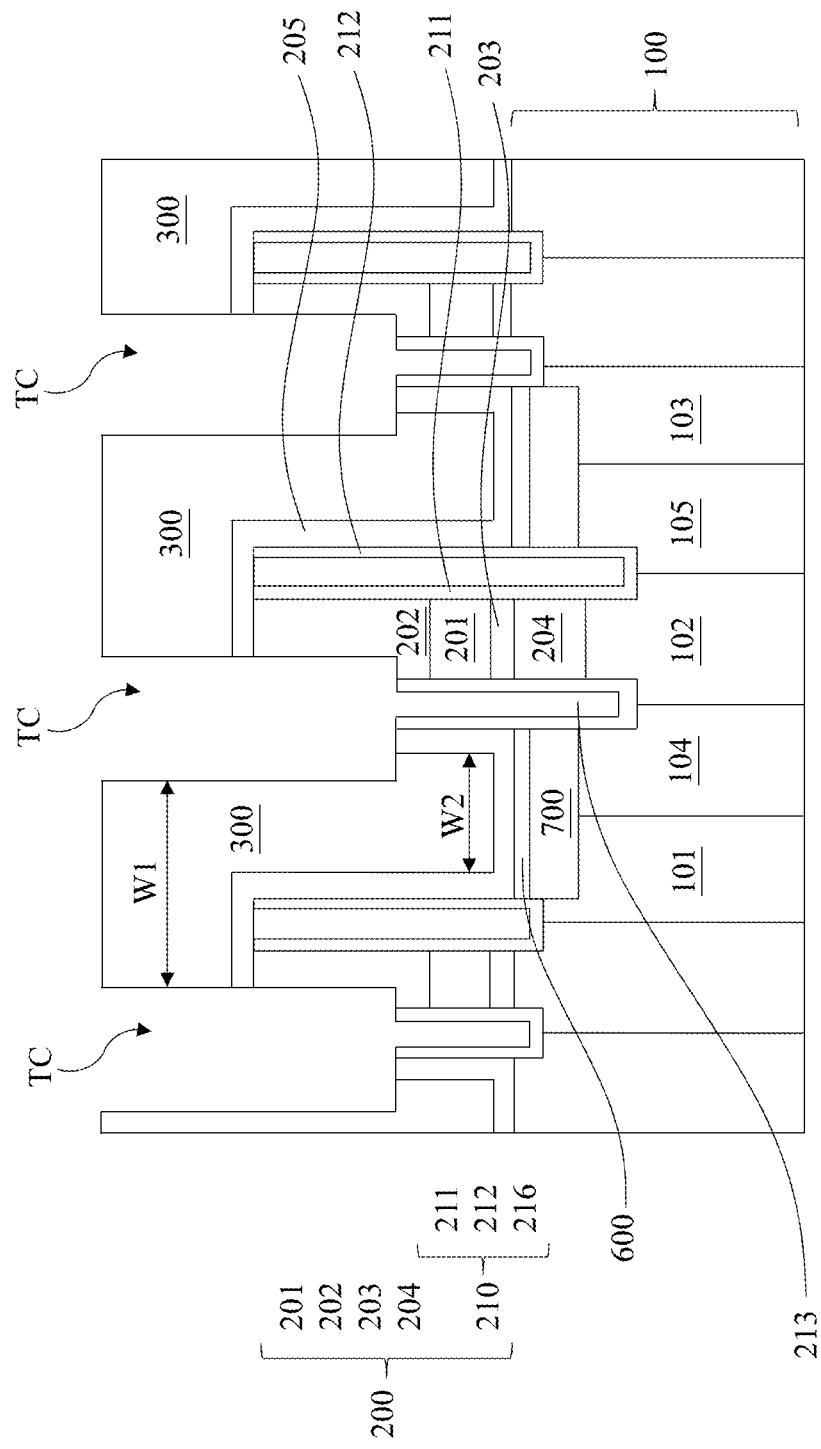
FIG. 27 is a schematic view in a step of the manufacturing process of the semiconductor structure shown in FIG. 1 according to some embodiments of the present disclosure.

In operation S208, the air gap 213 within the sidewall 210 of the bit line structure 200 is formed. In some embodiments, the operation S208 includes an operation S2081, in operation S2081, the middle oxide layer 216 is etched, and the space occupied by the original middle oxide layer 216 becomes the air gap 213. In FIG. 27, the schematic view V27 shows that the air gap 213 which is connected to the trenches TC. In some embodiments, the middle oxide layer 216 is etched by gaseous hydrofluoric acid. However, the etchant used in the operation S2081 is not limited to gaseous hydrofluoric acid. In other embodiments, the operation S2081 uses other suitable etchant to etch the middle oxide layer 216.

Figure 28:
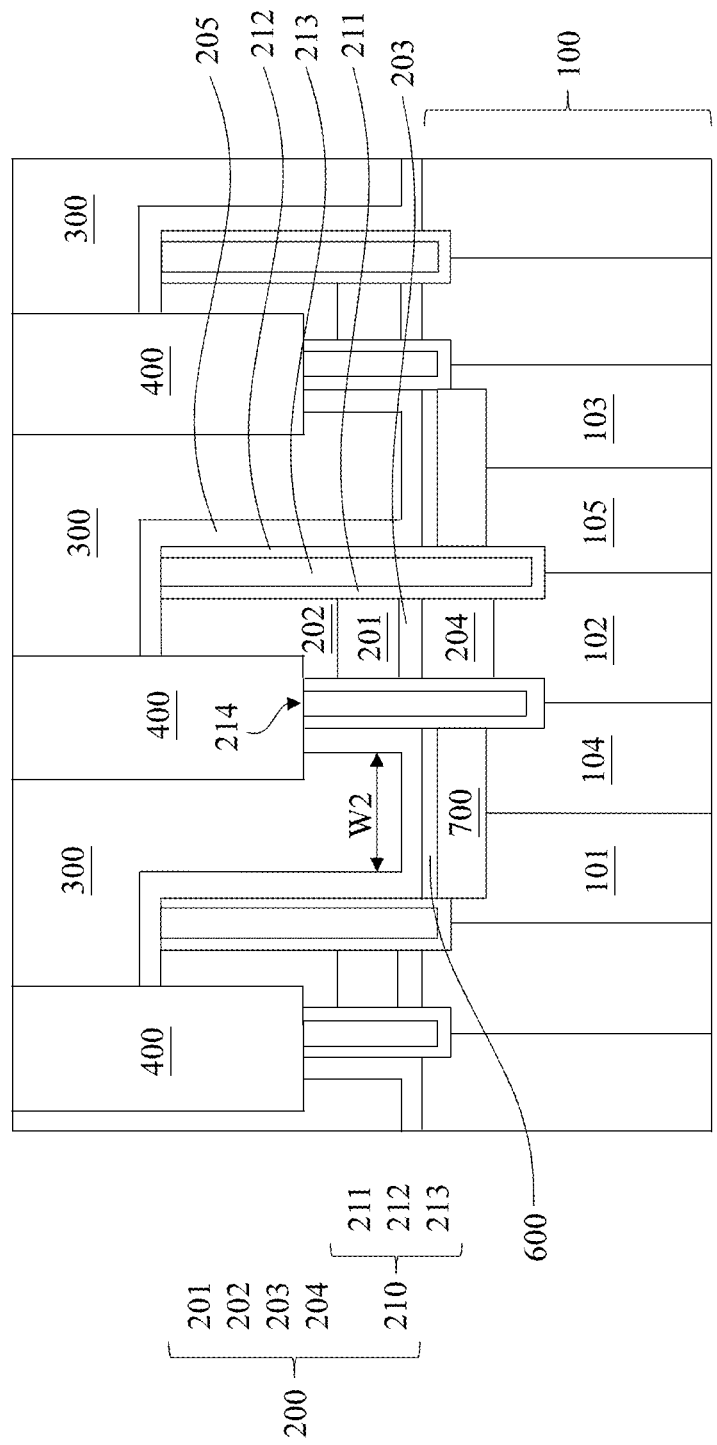
FIG. 28 is a schematic view in a step of the manufacturing process of the semiconductor structure shown in FIG. 1 according to some embodiments of the present disclosure.

In operation S209, the dielectric layer 400 is filled in the trenches TC to seal the air gap 213. In operation S210, the dielectric layer 400 is planarized. In FIG. 28, the schematic view V28 shows that the top surface 214 of the sidewall 210 is covered by the dielectric layer 400, and the air gap 213 is sealed by the filled dielectric layer 400. In addition, the dielectric layer 400 and the capacitor landing pads 300 are coplanar after the planarization.

In operation S211, the dielectric layer 500 is deposited on the capacitor land pads 300. After the operation S211, the semiconductor structure 10 shown in FIG. 1 is formed.

In some embodiments, after the operation S211, a planarization process is performed to planarize the dielectric layer 500 so as to form another capacitor pad (not shown) on the dielectric layer 500 opposite to the capacitor landing pads 300.

One aspect of the present disclosure provides a method for manufacturing a semiconductor structure with capacitor landing pads. The method includes the following operations: providing a semiconductor substrate; forming a bit line structure protruding from the semiconductor substrate; depositing a landing pad layer to cover the bit line structure; planarizing a top surface of the landing pad layer; forming a trench in the landing pad layer to form the capacitor landing pads; forming an air gap within a sidewall of the bit line structure; and filling a first dielectric layer in the trench to seal the air gap.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for manufacturing a semiconductor structure with capacitor landing pads, comprising:
    providing a semiconductor substrate;
    forming a bit line structure protruding from the semiconductor substrate;
    depositing a landing pad layer to cover the bit line structure;
    planarizing a top surface of the landing pad layer;
    forming a trench in the landing pad layer to form the capacitor landing pads;
    forming an air gap within a sidewall of the bit line structure; and
    filling a first dielectric layer in the trench to seal the air gap;
    wherein forming the trench in the landing pad layer to form the capacitor landing pads comprises:
        depositing a plurality of masking layers on the landing pad layer;
        performing a forward double patterning on the plurality of masking layers to form a hard mask on the landing pad layer; and
        etching the landing pad layer to form the trench according to the hard mask.

2. The method of claim 1, wherein depositing the plurality of masking layers on the landing pad layer comprises:
    depositing a first carbon layer on the landing pad layer; and
    depositing a second dielectric layer on the first carbon layer.

3. The method of claim 2, wherein depositing the plurality of masking layers on the landing pad layer further comprises:
    forming a second carbon layer on the second dielectric layer;
    forming a third dielectric layer on the second carbon layer;
    forming a third carbon layer on the third dielectric layer; and
    forming a fourth dielectric layer on the third carbon layer.

4. The method of claim 3, wherein a height of the first carbon layer is substantially equal to 90 nm, the second dielectric layer includes silicon nitride, the third dielectric layer is a dielectric anti-reflective coating including silicon, and the fourth dielectric layer is a dielectric anti-reflective coating including oxygen.

5. The method of claim 3, wherein performing the forward double patterning on the plurality of masking layers to form the hard mask on the landing pad layer comprises:
    patterning the fourth dielectric layer and the third dielectric layer; and
    etching the fourth dielectric layer, the third carbon layer, the third dielectric layer, and the second carbon layer to form a plurality of carbon rods in the second carbon layer.

6. The method of claim 5, wherein performing the forward double patterning on the plurality of masking layers to form the hard mask on the landing pad layer further comprises:
    deposition an oxide layer to cover the plurality of carbon rods.

7. The method of claim 6, wherein the oxide layer is deposited by an atomic layer deposition (ALD) technology.

8. The method of claim 6, wherein performing the forward double patterning on the plurality of masking layers to form the hard mask on the landing pad layer further comprises:
    planarizing a top surface of the oxide layer, wherein the top surface of the oxide layer and a top surface of the plurality of carbon rods are coplanar, wherein the remained oxide layer is an upper portion of the hard mask.

9. The method of claim 8, wherein performing the forward double patterning on the plurality of masking layers to form the hard mask on the landing pad layer further comprises:
    etching the plurality of carbon rods, the second dielectric layer, and the first carbon layer to form the hard mask according to the remained oxide layer.

10. The method of claim 9, wherein etching the landing pad layer to form the trench according to the hard mask comprises:

etching a portion of the sidewall and a portion of a nitride layer of the bit line structure to expose a top surface of the sidewall of the bit line structure.

11. The method of claim 10, wherein etching the landing pad layer to form the trench according to the hard mask further comprises etching the landing pad layer to reach a top surface of the bit line structure; and etching a portion of an adhesive layer of the bit line structure, wherein the adhesive layer includes titanium nitride.

12. The method of claim 1, wherein forming the trench in the landing pad layer to form the capacitor landing pads further comprises:

performing an ashing etching to remove the plurality of masking layers.

13. The method of claim 1, wherein the sidewall of the bit line structure includes an inner dielectric layer, an outer dielectric layer, and a middle oxide layer disposed between the inner dielectric layer and the outer dielectric layer, wherein forming the air gap within the sidewall of the bit line structure comprises:

etching the middle oxide layer.

14. The method of claim 13, wherein the middle oxide layer is etched by gaseous hydrofluoric acid.

15. The method of claim 1, further comprising:

planarizing the first dielectric layer, wherein the first dielectric layer and the capacitor landing pads are coplanar; and depositing a fifth dielectric layer on the first dielectric layer and the capacitor landing pads, wherein the fifth dielectric layer includes silicon nitride.

16. The method of claim 1, wherein the trench is partially aligned with the bit line structure.

17. The method of claim 1, wherein the semiconductor substrate includes a first active region, a second active region, and an isolation region disposed between the first active region and the second active region, wherein a bit line contact structure of the bit line structure is formed in contact with the first active region.

18. The method of claim 17, further comprising:

forming a landing pad contact structure coupled the second active region of the semiconductor substrate; and forming a cobalt silicide layer coupled the landing pad contact structure.

19. The method of claim 1, wherein each of the capacitor landing pads has a step shape, wherein a width of an upper portion of the capacitor landing pads is greater than a width of a bottom portion of the capacitor landing pads.

* * * * *